(12) United States Patent
Lee et al.

(10) Patent No.: US 12,236,877 B2
(45) Date of Patent: Feb. 25, 2025

(54) DISPLAY DEVICE AND DRIVING METHOD

(71) Applicant: LG Display Co., Ltd., Seoul (KR)

(72) Inventors: DongYoon Lee, Seoul (KR); InHyo Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/520,043

(22) Filed: Nov. 27, 2023

(65) Prior Publication Data

US 2024/0257747 A1 Aug. 1, 2024

(30) Foreign Application Priority Data

Jan. 27, 2023 (KR) ........................ 10-2023-0010487

(51) Int. Cl.
*G09G 3/3233* (2016.01)
(52) U.S. Cl.
CPC ... G09G 3/3233 (2013.01); *G09G 2300/0413* (2013.01); *G09G 2300/0842* (2013.01); *G09G 2310/08* (2013.01); *G09G 2320/02* (2013.01); *G09G 2330/021* (2013.01)

(58) Field of Classification Search
None
See application file for complete search history.

(56) References Cited

U.S. PATENT DOCUMENTS

| 2006/0066252 A1* | 3/2006 | Kim | G09G 3/3233 |
| | | | 315/169.3 |
| 2010/0265228 A1* | 10/2010 | Kimura | G09G 3/3233 |
| | | | 345/207 |
| 2016/0217726 A1 | 7/2016 | Guo et al. | |
| 2017/0365206 A1 | 12/2017 | Kim et al. | |
| 2018/0120992 A1* | 5/2018 | Lee | G06F 3/047 |
| 2020/0227514 A1 | 7/2020 | Tian | |
| 2020/0365071 A1* | 11/2020 | Jeong | G09G 3/2003 |
| 2022/0101799 A1* | 3/2022 | Lee | G09G 3/3275 |

* cited by examiner

*Primary Examiner* — Parul H Gupta
(74) *Attorney, Agent, or Firm* — Seed IP Law Group LLP

(57) ABSTRACT

A display device and a driving method thereof. While a turn-on gate signal is being supplied to a first gate line, a dummy voltage is supplied to a first type data line, and a first image frame voltage for expressing a first image frame line is supplied to a second type data line. The readability of an image frame is improved.

9 Claims, 25 Drawing Sheets

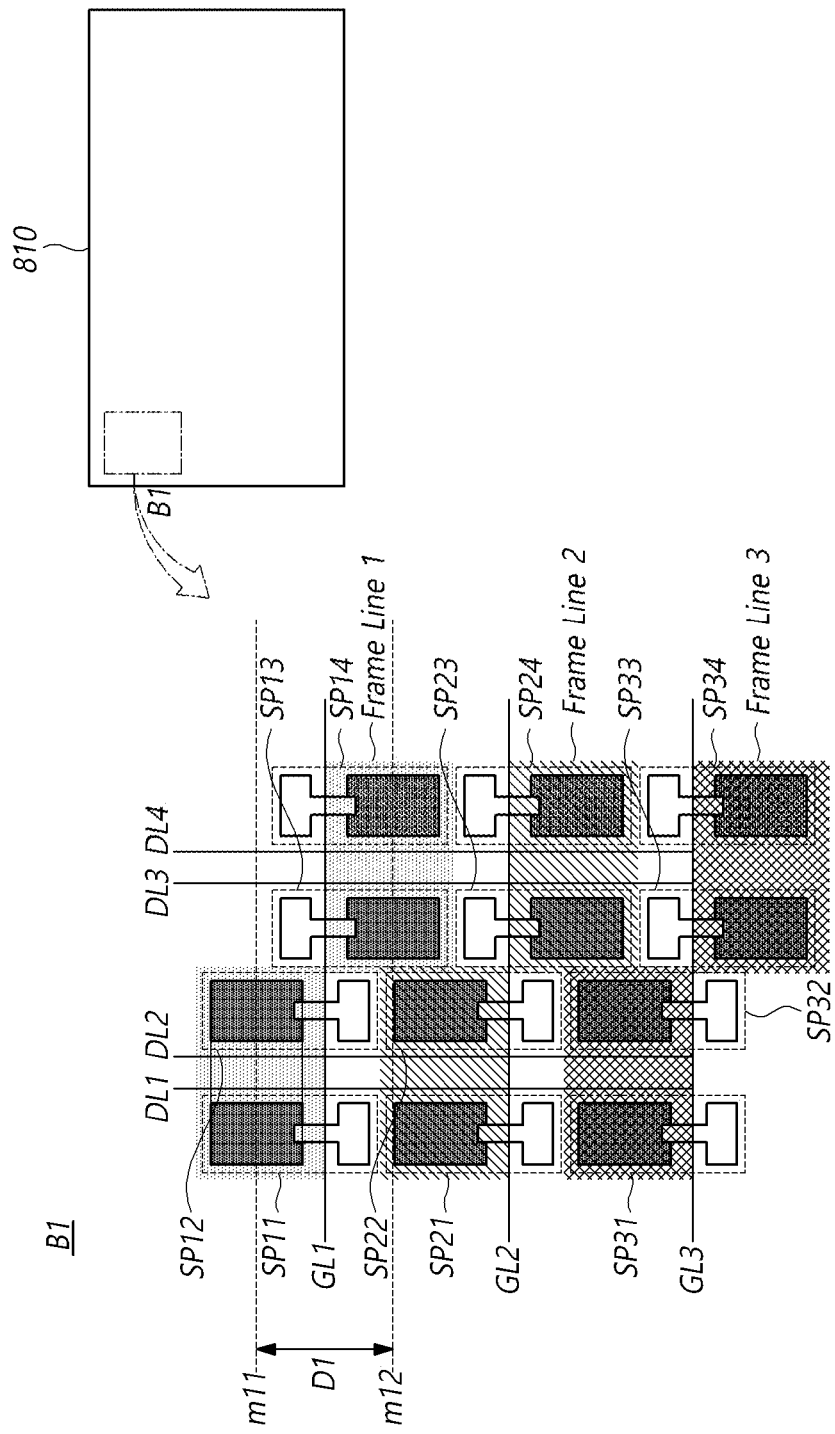

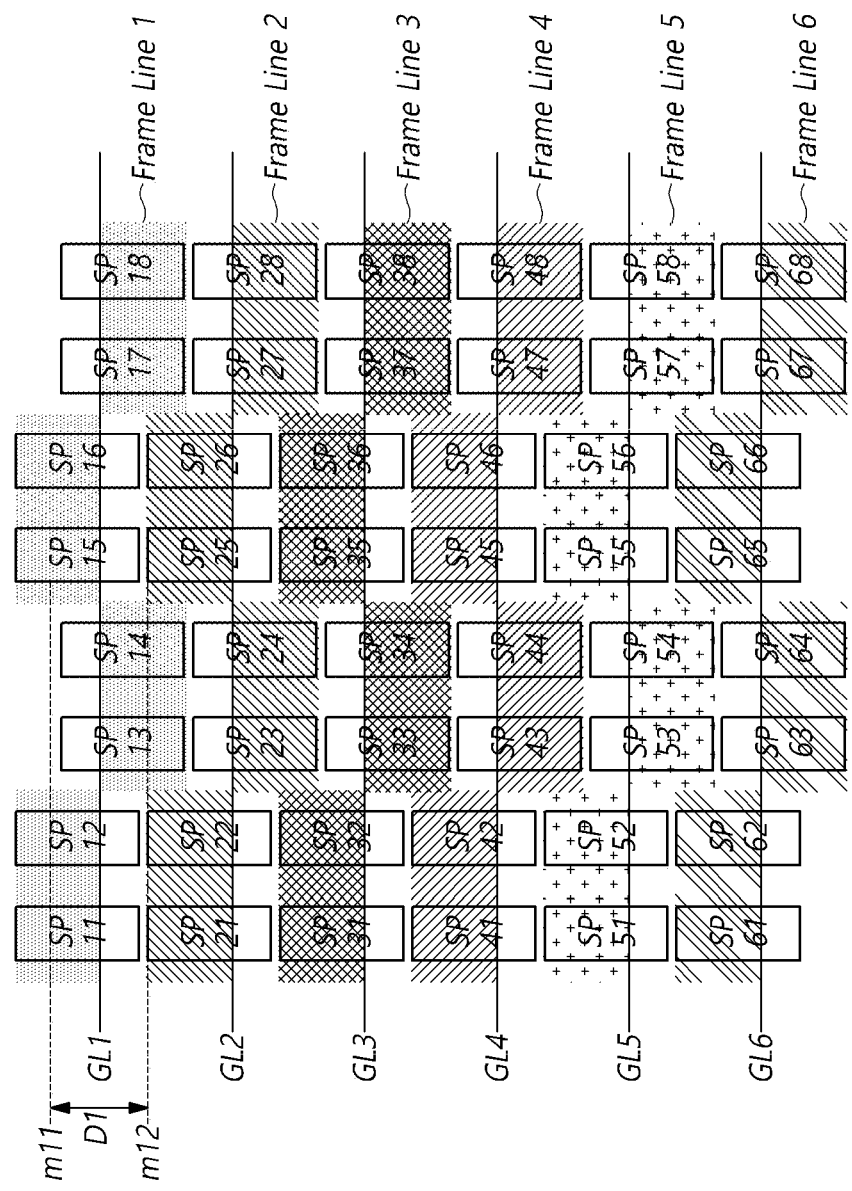

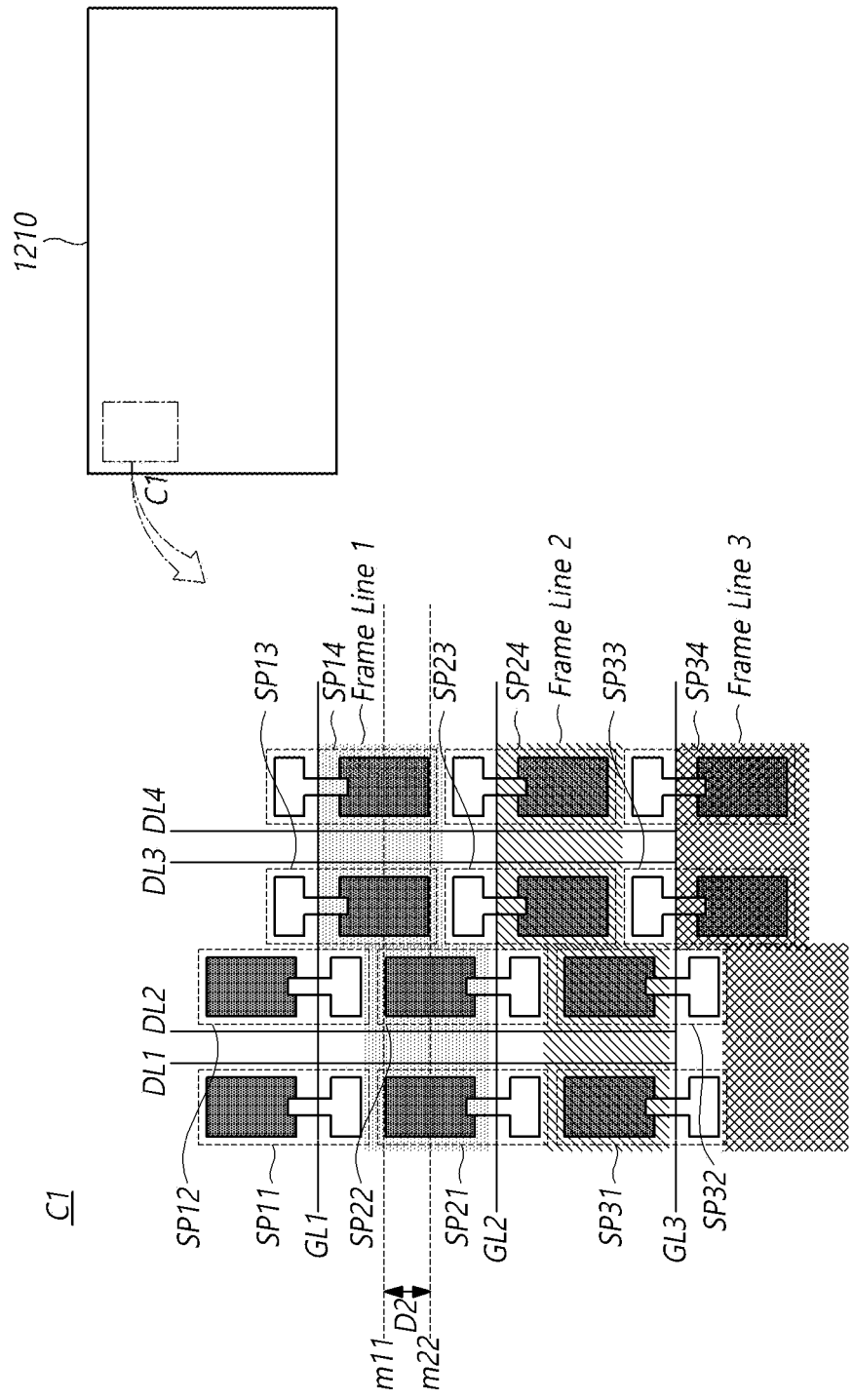

DISPLAY DEVICE AND DRIVING METHOD

CROSS REFERENCE TO RELATED APPLICATION

This application claims priority from Korean Patent Application No. 10-2023-0010487, filed on Jan. 27, 2023, which is hereby incorporated by reference for all purposes as if fully set forth herein.

BACKGROUND

Technical Field

Embodiments relate to a display device and a driving method thereof.

Description of the Related Art

In response to the development of the information society, demand for various types of image display devices is increasing. Recently, a range of display devices, such as liquid crystal display (LCD) devices and organic light-emitting diode (OLED) display devices, have recently come into widespread use.

Among display devices currently being developed, there is provided a self-light-emitting display device in which respective subpixels disposed on a display panel include a light-emitting device.

When the light-emitting devices disposed on the display panel are driven to generate light, image frames may be expressed on the display panel.

A plurality of subpixels may be disposed on the display panel in a matrix pattern. In this case, the subpixels may be disposed side by side in row and column directions.

In addition, the plurality of subpixels may be disposed on the display panel in a pattern different from a matrix pattern.

BRIEF SUMMARY

When the plurality of subpixels are disposed on the display panel in a pattern different from a matrix pattern, readability may be reduced.

In this regard, embodiments of the present disclosure may provide a display device and a driving method thereof in which readability is improved.

Embodiments of the present disclosure may provide a display device and a driving method thereof in which low power driving is enabled due to improved readability.

Embodiments of the present disclosure may provide a display device including a plurality of subpixels electrically connected to a plurality of data lines and a plurality of gate lines. An image frame voltage may be supplied to the plurality of data lines as a data voltage for expressing an image frame. The image frame may be expressed by a plurality of image frame lines. The plurality of data lines may include a first type data line and a second type data line. While a turn-on gate signal is being supplied to a first gate line among the plurality of gate lines, a dummy voltage different from the image frame voltage may be supplied to the first type data line, and a first image frame voltage for expressing a first image frame line may be supplied to the second type data line.

Embodiments of the present disclosure may provide a display device including a plurality of subpixels electrically connected to a plurality of data lines and a plurality of gate lines. An image frame voltage may be supplied to the plurality of data lines as a data voltage for expressing an image frame, the image frame is expressed by a plurality of image frame lines. Each of the plurality of subpixels may include an open area for expressing the image frame and a circuit part on which a circuit allowing light to exit through the open area is disposed. The open area for expressing the image frame may be disposed between a first gate line and a second gate line among the plurality of gate lines.

Embodiments of the present disclosure may provide a display device including a plurality of subpixels electrically connected to a plurality of data lines and a plurality of gate lines. The plurality of gate lines may include first to (n+1)th gate lines. A dummy voltage may be supplied to a first subpixel among the plurality of subpixels electrically connected to a first data line among the plurality of gate lines and the first gate line. The dummy voltage may be supplied to a second subpixel among the plurality of subpixels electrically connected to a second data line among the plurality of gate lines and the (n+1)th gate line.

Embodiments of the present disclosure may provide a display device driving method including: supplying a voltage to a plurality of subpixels respectively including a light-emitting device expressing an image frame and a driving transistor driving the light-emitting device; a floating operation of increasing a voltage of a source node of the driving transistor; and generating light from the light-emitting device. The image frame comprises a plurality of image frame lines. The supply of the voltage may include: supplying a turn-on gate signal to a first gate line electrically connected to a first subpixel and a second subpixel among the plurality of subpixels; supplying a first image frame voltage for expressing a first image frame line to a second data line electrically connected to the second subpixel; and supplying a dummy voltage different from the first image frame voltage to a first data line electrically connected to the first subpixel.

According to embodiments, the display device and the driving method thereof in which readability is improved may be provided.

According to embodiments, the display device and the driving method thereof in which low power driving is enabled due to improved readability may be provided.

BRIEF DESCRIPTION OF THE SEVERAL VIEWS OF THE DRAWINGS

The above and other objectives, features, and advantages of the present disclosure will be more clearly understood from the following detailed description, taken in conjunction with the accompanying drawings, in which:

FIGS. 11A to 11C are diagrams illustrating a first open area distance difference between subpixels disposed in a zigzag pattern according to embodiments;

FIGS. 12A to 12C are diagrams illustrating a second open area distance difference between subpixels disposed in a zigzag pattern according to embodiments;

DETAILED DESCRIPTION

Figure 1:
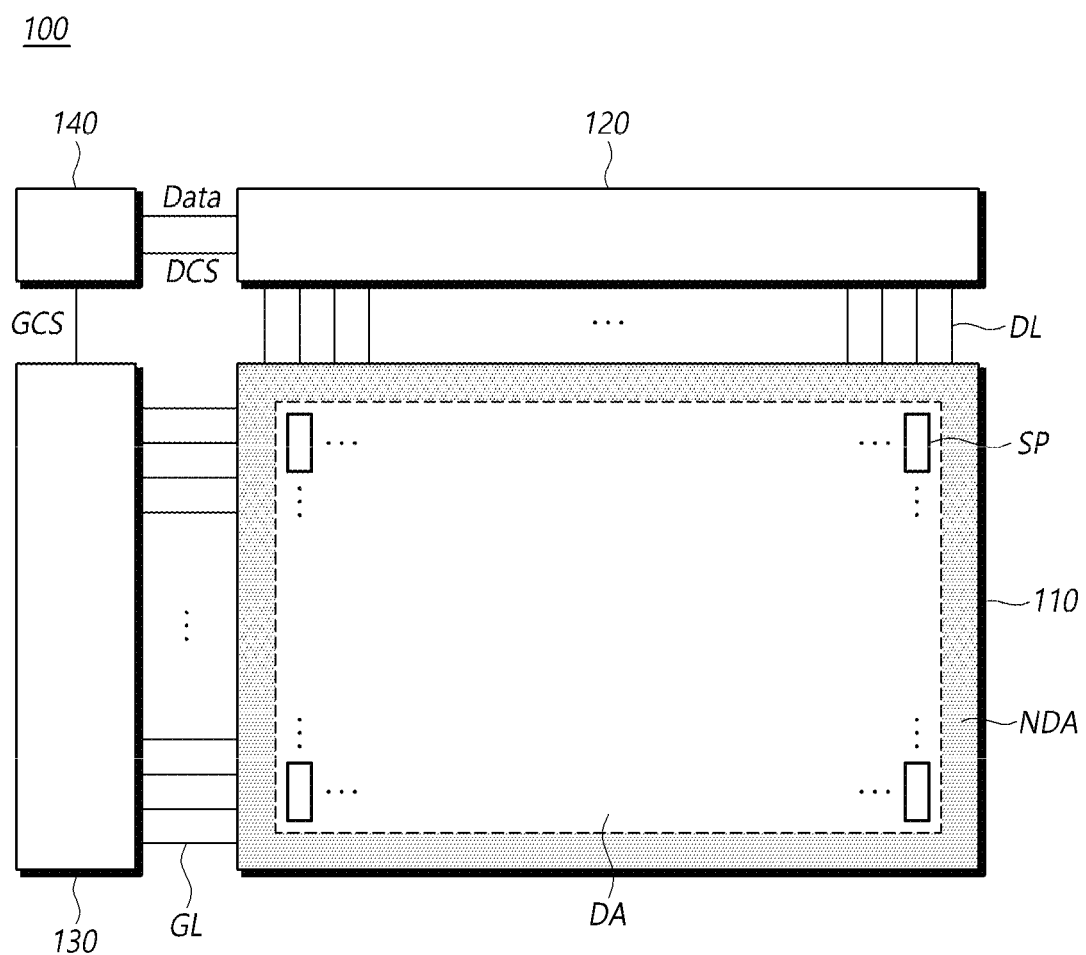
FIG. 1 is a diagram illustrating a system configuration of a display device according to embodiments.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

A "predetermined" value, parameter, threshold, condition or setting can be dynamically determined or adjusted by a machine with or without human inputs. A "predetermined" value, parameter, threshold, condition or setting does not mean or limit to that the value, parameter, threshold, condition or setting is fixed or is input by a human.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, a variety of embodiments of the present disclosure will be described in detail with reference to the accompanying drawings.

FIG. 1 is a diagram illustrating a system configuration of a display device 100 according to embodiments.

Referring to FIG. 1, the display device 100 according to embodiments may include a display panel 110 and a driver circuit driving the display panel 110.

The display panel 110 may include signal lines, such as a plurality of data lines DL and a plurality of gate lines GL, and a plurality of subpixels SP. The display panel 110 may include a display area (or active area) DA on which images are displayed and a non-display area (or non-active area) NDA on which no images are displayed. In the display panel 110, the plurality of subpixels SP for displaying images are disposed in the display area DA, a pad part may be disposed in the non-display area NDA. Here, driver circuits 120, 130, and 140 may be electrically connected to or mounted on the pad part, and integrated circuits (ICs), printed circuits, and the like may be connected to the pad part.

Figure 4:
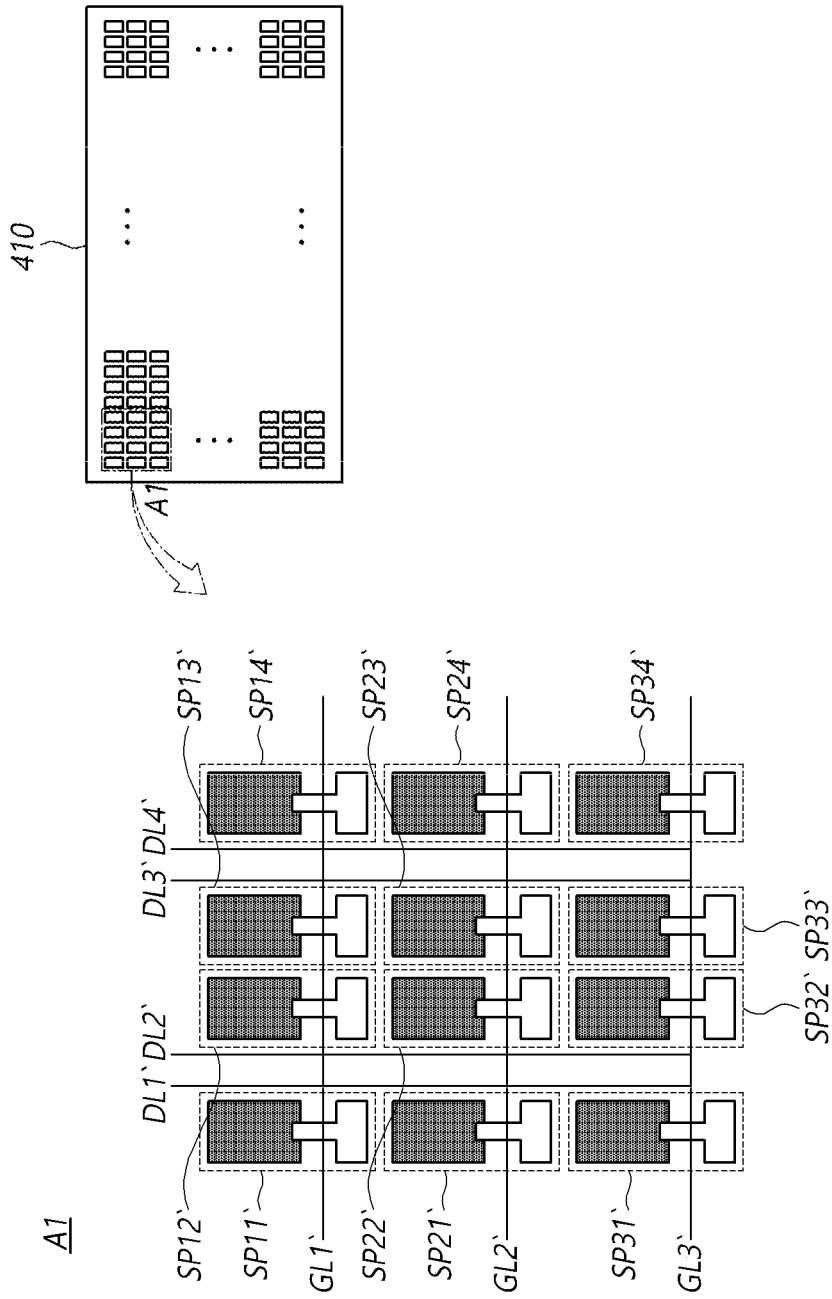
FIG. 4 is a diagram illustrating the display panel and the plurality of subpixels according to embodiments.
Figure 8:
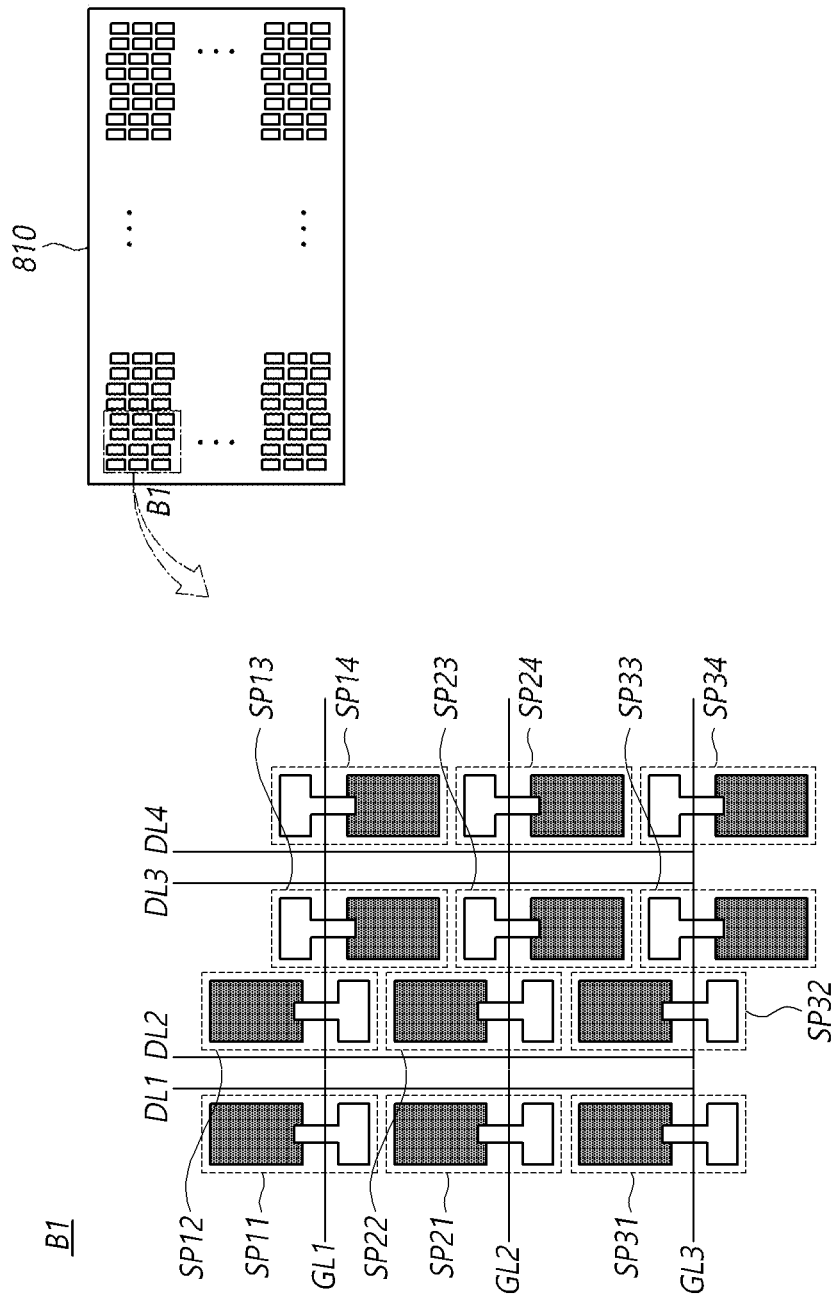
FIG. 8 is a diagram illustrating a zigzag pattern of a plurality of subpixels disposed in the display panel according to embodiments.
Figure 12B:
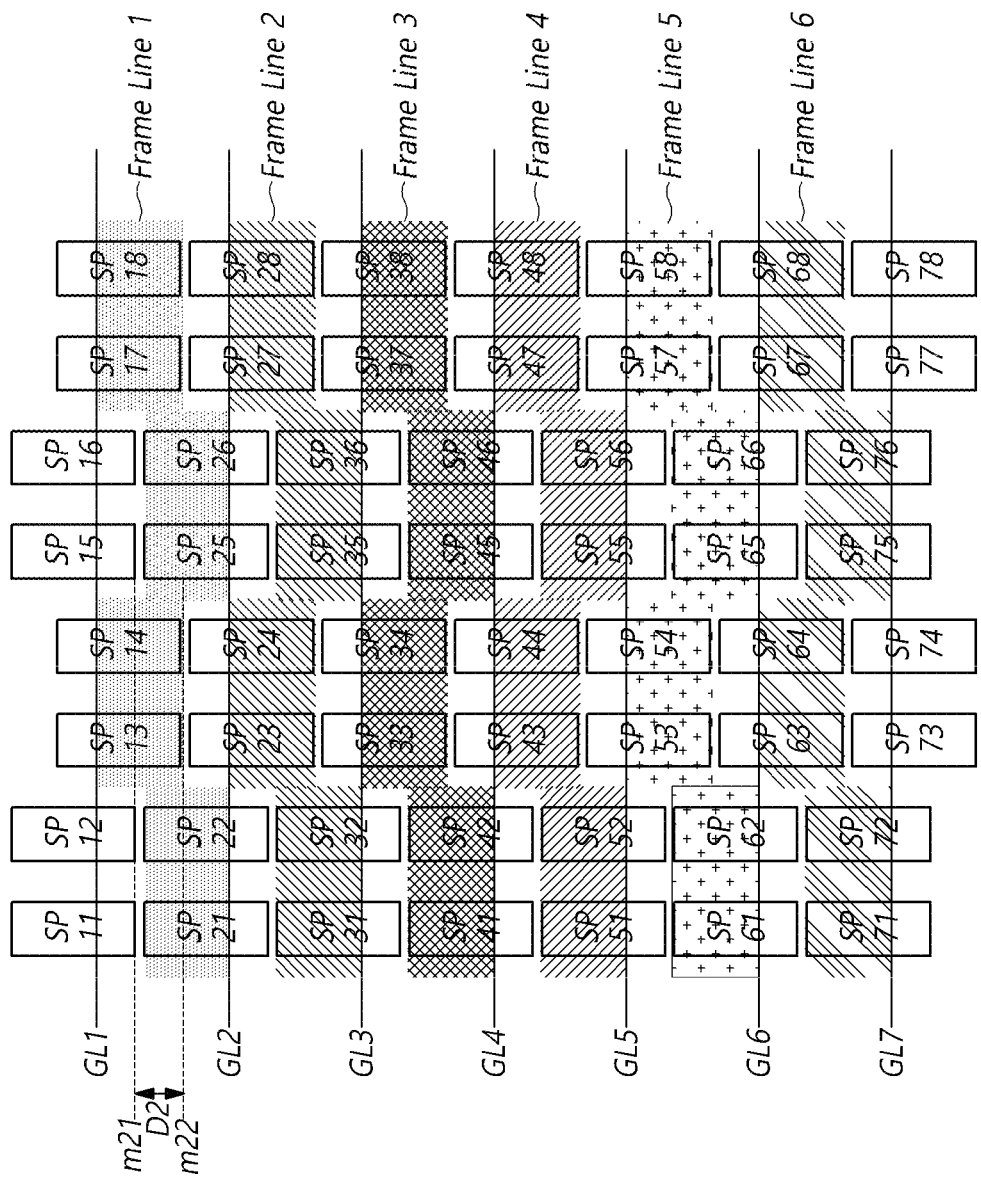
Figure 12C:
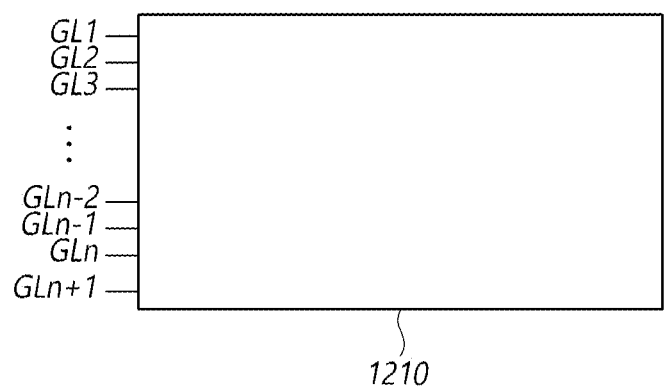

The display panel 110 may be a display panel 410 illustrated in FIG. 4, a display panel 810, illustrated in FIG. 8, or a display panel 1210 illustrated in FIGS. 12A to 12C.

The driver circuits may include a data driver circuit 120, a gate driver circuit 130, and the like, and may further include a controller 140 controlling the data driver circuit 120 and the gate driver circuit 130.

The data driver circuit 120 is a circuit for driving the plurality of data lines DL, and may supply data signals to the plurality of data lines DL. The gate driver circuit 130 is a circuit for driving the plurality of gate lines GL, and may supply gate signals to the plurality of gate lines GL.

The gate driver circuit 130 may output a gate signal having a turn-on-level voltage or a gate signal having a turn-off-level voltage under the control of the controller 140. The gate driver circuit 130 may sequentially drive the plurality of gate lines GL by sequentially supplying the gate signal having a turn-on-level voltage to the plurality of gate lines GL.

The controller 140 may supply a data control signal DCS to the data driver circuit 120 in order to control operation timing of the data driver circuit 120. The controller 140 may supply a gate control signal GCS to the gate driver circuit 130 in order to control operation timing of the gate driver circuit 130.

The display controller 140 may start scanning at timing realized for respective frames, convert image data input from an external source into a data signal format used by the data driver circuit 120, supply the converted image data Data to the data driver circuit 120, and control data driving at appropriate points in time in response to the scanning.

The controller 140 receives timing signals, such as a vertical synchronization signal Vsync, a horizontal synchronization signal Hsync, an input data enable signal DE, and a clock signal CLK, generates a variety of control signals DCS and GCS, outputs the control signals DCS and GCS to the data driver circuit 120 and the gate driver circuit 130 in order to control the data driver circuit 120 and the gate driver circuit 130.

The controller 140 may be provided as a component separate from the data driver circuit 120 or may be combined with the data driver circuit 120 into an integrated circuit.

The data driver circuit 120 drives the plurality of data lines DL by supplying a data voltage to the plurality of data lines DL in response to the image data Data input from the controller 140. Here, the data driver circuit 120 will also be referred to as a source driver circuit. The data driver circuit 120 may include one or more source driver integrated circuits (SDICs). Each of the SDICs may include a shift register, a latch circuit, a digital-to-analog converter (DAC), an output buffer, and the like. In some cases, each of the SDICs may further include an analog-to-digital converter (ADC).

For example, each of the SDICs may be connected to the display panel 110 using a tape-automated bonding (TAB) structure, may be connected to a bonding pad of the display panel 110 using a chip-on-glass (COG) structure or a chip-on-panel (COP) structure, or may be implemented using a chip-on-film (COF) structure connected to the display panel 110.

The gate driver circuit 130 may be connected to the display panel 110 using a TAB structure, may be connected to bonding pads of the display panel 110 using a COG structure or a COP structure, or may be connected to the display panel 110 using a COF structure. Alternatively, the gate driver circuit 130 may be provided in the non-display area NDA of the display panel 110 using a gate-in-panel (GIP) structure.

When a specific gate line GL is opened by the gate driver circuit 130, the data driver circuit 120 may convert the image data Data received from the controller 140 into an analog data voltage and supply the analog data voltage to the plurality of data lines DL.

The data driver circuit 120 may be connected to one side (e.g., the upper portion or the lower portion) of the display panel 110. The data driver circuit 120 may be connected to both sides (e.g., the upper portion and the lower portion) of the display panel 110 or two or more sides of four sides of the display panel 110, depending on the driving method, the design of the display panel, or the like.

The gate driver circuit 130 may be connected to one side (e.g., the left portion or the right portion) of the display panel 110. The gate driver circuit 130 may be connected to both sides (e.g., the left portion and the right portion) of the display panel 110 or two or more sides of four sides of the display panel 110, depending on the driving method, the design of the display panel, or the like.

The controller 140 may be a timing controller 140 used in typical display technology, may be a control device including the timing controller 140 and able to perform other control functions, may be a control device different from the timing controller 140, or a circuit inside a control device. The controller 140 may be implemented using a variety of circuits or electronic components such as an integrated circuit (IC), a field programmable gate array (FPGA), an application specific integrated circuit (ASIC), or a processor.

The controller 140 may be mounted on a printed circuit board (PCB), a flexible printed circuit (FPC), or the like, or may be electrically connected to the data driver circuit 120 and the gate driver circuit 130 through the PCB, the FPC, or the like. The controller 140 may transmit and receive signals to and from the data driver circuit 120 through one or more predetermined interfaces. For example, the interfaces may include a low voltage differential signaling (LVDS) interface, an embedded panel interface (EPI), a serial peripheral interface (SPI), or the like. The controller 140 may include a memory location such as at least one register.

The display device 100 according to embodiments may be a self-light-emitting display device, such as an organic light-emitting diode (OLED) display, a quantum dot display, or a micro-light-emitting diode (micro-LED) display.

Figure 2:
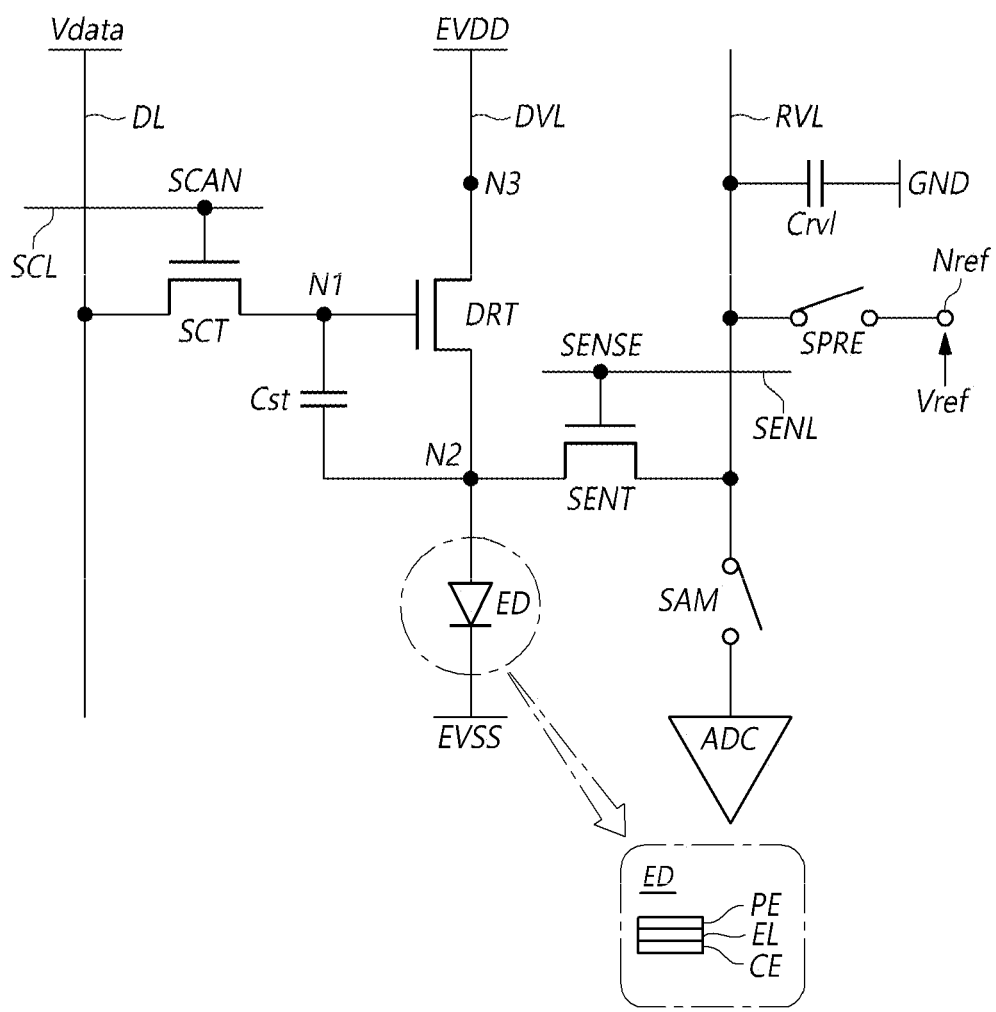
FIG. 2 is a diagram illustrating an equivalent circuit of a subpixel of the display device according to embodiments.

FIG. 2 is a diagram illustrating an equivalent circuit of a subpixel SP of the display device 100 according to embodiments.

Referring to FIG. 2, each of the plurality of subpixels SP disposed in the display panel 110 of the display device 100 according to embodiments may include an emitting device ED, a driving transistor DRT, a scan transistor SCT, a sensing transistor SENT, a storage capacitor Cst, and the like. When the subpixel SP includes three transistors DRT, SCT, and SENT and a single capacitor Cst as described above, the subpixel SP will be referred to as having a 3T1C structure.

The emitting device ED may include a pixel electrode PE, a common electrode CE, and an emitting layer EL located between the pixel electrode PE and the common electrode CE. Here, the pixel electrodes PE may be disposed in the subpixels SP, respectively, and the common electrode CE may be disposed in the plurality of subpixels SP in common. In an example, the pixel electrode PE may be an anode, and the common electrode CE may be a cathode. In another example, the pixel electrode PE may be a cathode, and the common electrode CE may be an anode. For example, the emitting device ED may be an OLED, a micro-LED, a quantum dot ED, or the like. As the emitting device ED generates light, an image frame may be expressed.

The driving transistor DRT may be a transistor for driving the emitting device ED, and may include a first node N1, a second node N2, a third node N3, and the like.

The first node N1 of the driving transistor DRT may be a gate node of the driving transistor DRT and electrically connected to a source node or a drain node of the scan transistor SCT. The second node N2 of the driving transistor DRT may be a source node or a drain node of the driving transistor DRT, electrically connected to a source node or a drain node of the sensing transistor SENT, and electrically connected to the pixel electrode PE of the emitting device ED. The third node N3 of the driving transistor DRT may be electrically connected to a drive voltage line DVL through which a drive voltage EVDD is supplied.

The scan transistor SCT may be controlled by a scan signal SCAN, and may be connected to the first node N1 of the driving transistor DRT and a data line DL. The scan transistor SCT may be turned on or off by the scan signal SCAN supplied through a scan signal line SCL, i.e., a type of gate line GL, to control the connection between the data line DL and the first node N1 of the driving transistor DRT.

The scan transistor SCT may be turned on by the scan signal SCAN having a turn-on-level voltage to transfer a data voltage Vdata supplied through the data line DL to the first node N1 of the driving transistor DRT.

The turn-on-level voltage of the scan signal SCAN, by which the scan transistor SCT may be turned on, may be a high-level voltage or a low-level voltage. The turn-off-level voltage of the scan signal SCAN capable of turning off the scan transistor SCT may be a low-level voltage or a high-level voltage. In an example, when the scan transistor SCT is an n-type transistor, the turn-on-level voltage may be a high-level voltage, and the turn-off-level voltage may be a low-level voltage. In another example, when the scan transistor SCT is a p-type transistor, the turn-on-level voltage may be a low-level voltage, and the turn-off-level voltage may be a high-level voltage.

The sensing transistor SENT may be controlled by a sense signal SENSE, and may be connected to the second node N2 of the driving transistor DRT and a reference voltage line RVL. The sensing transistor SENT may be turned on or off by the sense signal SENSE supplied through a sense signal line SENL, i.e., a type of gate line GL, to control the connection between the reference voltage line RVL and the second node N2 of the driving transistor DRT.

The sensing transistor SENT may be turned on by the sense signal SENSE having a turn-on-level voltage to transfer a reference voltage Vref supplied through the reference voltage line RVL to the second node N2 of the driving transistor DRT.

The turn-on-level voltage of the sense signal SENSE, by which the sensing transistor SENT may be turned on, may be a high-level voltage or a low-level voltage. The turn-off-level voltage of the sense signal SENSE, by which the sensing transistor SENT may be turned off, may be a low-level voltage or a high-level voltage. In an example, when the sensing transistor SENT is an n-type transistor, the turn-on-level voltage may be a high-level voltage, and the turn-off-level voltage may be a low-level voltage. In another example, when the sensing transistor SENT is a p-type transistor, the turn-on-level voltage may be a low-level voltage, and the turn-off-level voltage may be a high-level voltage.

In addition, the display device 100 may further include: a line capacitor Crvl formed between the reference voltage line RVL and the ground GND; a sampling switch SAM controlling the connection between the reference voltage line RVL and an analog-to-digital converter ADC; and a power switch SPRE controlling the connection between the reference voltage line RVL and a reference voltage supply node Nref. The reference voltage Vref output from a power supply may be supplied to the reference voltage supply node Nref and applied to the reference voltage line RVL through the power switch SPRE.

In addition, the sensing transistor SENT may be turned on by the sense signal SENSE having a turn-on-level voltage to transfer a voltage V2 of the second node N2 of the driving transistor DRT to the reference voltage line RVL. Thus, the line capacitor Crvl formed between the reference voltage line RVL and the ground GND may be charged.

The function of the sensing transistor SENT transferring the voltage V2 of the second node N2 of the driving transistor DRT to the reference voltage line RVL may be used in driving for sensing characteristics of the subpixel SP. In this case, the voltage transferred to the reference voltage line RVL may be a voltage by which the characteristics of the subpixel SP are obtained or a voltage in which the characteristics of the subpixel SP are reflected.

In the present disclosure, the characteristics of the subpixel SP may be characteristics of the driving transistor DRT or the emitting device ED. The characteristics of the driving transistor DRT may include the threshold voltage, mobility, and the like of the driving transistor DRT. The characteristics of the emitting device ED may include the threshold voltage of the emitting device ED.

Each of the driving transistor DRT, the scan transistor SCT, and the sensing transistor SENT may be an n-type transistor or a p-type transistor. In the present disclosure, for the convenience of explanation, each of the driving transistor DRT, the scan transistor SCT, and the sensing transistor SENT will be illustrated as being an n-type transistor.

The storage capacitor Cst may be connected to the first node N1 and the second node N2 of the driving transistor DRT. The storage capacitor Cst is charged with an amount of electric charge corresponding to the voltage difference between both ends (or both nodes), and serves to maintain the voltage difference between both ends during a predetermined frame time. Thus, the corresponding subpixel SP may generate light during the predetermined frame time.

The storage capacitor Cst may be an external capacitor intentionally designed to be provided externally of the driving transistor DRT, rather than a parasitic capacitor (e.g., Cgs or Cgd), i.e., an internal capacitor present between the gate node and the source node (or drain node) of the driving transistor DRT.

The scan signal line SCL and the sense signal line SENL may be different gate lines GL. In this case, the scan signal SCAN and the sense signal SENSE may be different gate signals, and on-off timing of the scan transistor SCT and on-off timing of the sensing transistor SENT in a single subpixel SP may be independent of each other. That is, on-off timing of the scan transistor SCT and on-off timing of the sensing transistor SENT in the single subpixel SP may be the same or different.

Alternatively, the scan signal line SCL and the sense signal line SENL may be the same gate line GL. That is, the gate node of the scan transistor SCT and the gate node of the sensing transistor SENT in the single subpixel SP may be connected to a single gate line GL. In this case, the scan signal SCAN and the sense signal SENSE may be the same gate signal, and on-off timing of the scan transistor SCT and on-off timing of the sensing transistor SENT in the single subpixel SP may be the same.

The reference voltage line RVL may be provided for respective single subpixel columns. Alternatively, the reference voltage line RVL may be disposed in groups of two or more subpixel columns. When the reference voltage line RVL is disposed in groups of two or more subpixel columns, the reference voltage Vref may be supplied to two or more subpixels SP through a single reference voltage line RVL.

Figure 3:
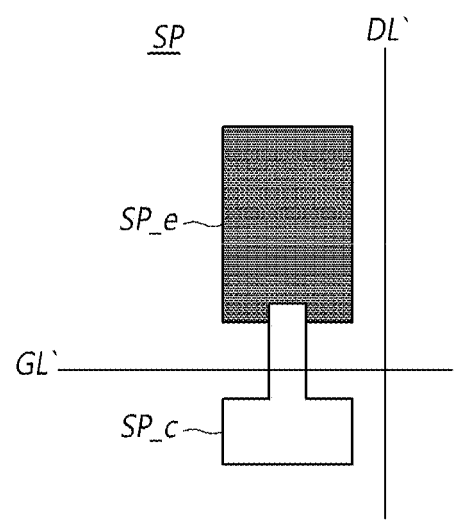
FIG. 3 is a schematic diagram illustrating an open area and a circuit portion of a subpixel disposed in the display panel according to embodiments.

FIG. 3 is a schematic diagram illustrating an open area SP_e and a circuit portion SP_c of a subpixel SP disposed in the display panel 110 according to embodiments.

A plurality of subpixels SP may be disposed in the display panel 110.

Each of the plurality of subpixels SP may include an open area SP_e and a circuit portion SP_c.

The open area SP_e is an area from which light is emitted when the subpixel SP generates light.

A single image frame may be expressed through the open area SP_e.

The image frame may be expressed using light emitted from the open area SP_e.

The circuit portion SP_c may be an area in which circuits allowing light to be emitted from the open area SP_e are disposed.

A portion of the circuit portion SP_c may overlap a portion of the open area SP_e.

Each of the plurality of subpixels SP may be electrically connected to a single data line DL' and a single gate line GL'. The data line DL' and the gate line GL' may be electrically connected to the circuit portion SP_c.

The circuit components, the circuit portion SP_c, and the open area SP_e included in the single subpixel SP have been described with reference to FIGS. 2 and 3. Hereinafter, the display panel 410 in which a plurality of subpixels SP' are disposed will be described.

FIG. 4 is a diagram illustrating the display panel 410 and the plurality of subpixels SP' according to embodiments.

Referring to FIG. 4, the plurality of subpixels SP' may be disposed in the display panel 410. Referring to FIG. 4, area A1 of the area of the display panel 410 may be viewed. The plurality of subpixels SP' may be disposed side by side in row and column directions. The characteristics of the plurality of subpixels SP' disposed in the display panel 410 will be described by referring to the plurality of subpixels SP' disposed in the area A1 for the convenience of explanation.

The plurality of subpixels SP' may include an xyth subpixel SPxy'. Here, x may indicate a row in which the subpixels SP' are disposed, and y may indicate a column in which the subpixels SP' are disposed. Hereinafter, each of the subpixels SP' may be defined in the form of an xyth subpixel SPxy'. Referring to FIG. 4, the plurality of subpixels SP' may include 11th to 34th subpixels SP11' to SP34'.

Each of the plurality of subpixels SP' may include a circuit portion SP_c and an open area SP_e.

The plurality of subpixels SP' may be electrically connected to a plurality of data lines DL' and a plurality of gate lines GL'.

The plurality of data lines DL' and the plurality of gate lines GL' may be disposed such that the data lines DL' intersect with the gate lines GL'. The plurality of data lines DL' may be disposed to extend longitudinally in a column direction while being disposed side by side in a row direction. The plurality of gate lines GL' may be disposed to extend horizontally in a row direction while being disposed side by side in a column direction. Here, the row direction and the column direction indicate only a relative difference. When the row direction is a column direction, the column direction may be a row direction.

A first data line DL1' may be electrically connected to the 11th subpixel SP11', the 21st subpixel SP21', and the 31st subpixel SP31'. The subpixels SP' electrically connected to the first data line DL1' may be disposed side by side in the column direction.

A second data line DL2' may be electrically connected to the 12th subpixel SP12', the 22nd subpixel SP22', and the 32nd subpixel SP32'. The subpixels SP' electrically connected to the second data line DL2' may be disposed side by side in the column direction.

A third data line DL3' may be electrically connected to the 13th subpixel SP13', the 23rd subpixel SP23', and the 33rd subpixel SP33'. The subpixels SP' electrically connected to the third data line DL3' may be disposed side by side in the column direction.

A fourth data line DL4' may be electrically connected to the 14th subpixel SP14', the 24th subpixel SP24', and the 34th subpixel SP34'. The subpixels SP' electrically connected to the fourth data line DL4' may be disposed side by side in the column direction.

A first gate line GL1' may be electrically connected to the 11th subpixel SP11', the 12th subpixel SP12', the 13th subpixel SP13', and the 14th subpixel SP14'. The subpixels SP' electrically connected to the first gate line GL1' may be disposed side by side in the row direction.

A second gate line GL2' may be electrically connected to the 21st subpixel SP21', the 22nd subpixel SP22', the 23rd subpixel SP23', and the 24th subpixel SP24'. The subpixels SP' electrically connected to the second gate line GL2' may be disposed side by side in the row direction.

A third gate line GL3' may be electrically connected to the 31st subpixel SP31', the 32nd subpixel SP32', the 33rd subpixel SP33', and the 34th subpixel SP34'. The subpixels SP' electrically connected to the third gate line GL3' may be disposed side by side in the row direction.

The plurality of subpixels SP disposed in the display panel 410 have been described with reference to FIG. 4. Hereinafter, a method of driving the display panel 410 through the plurality of subpixels SP' will be described in detail.

Figure 5:
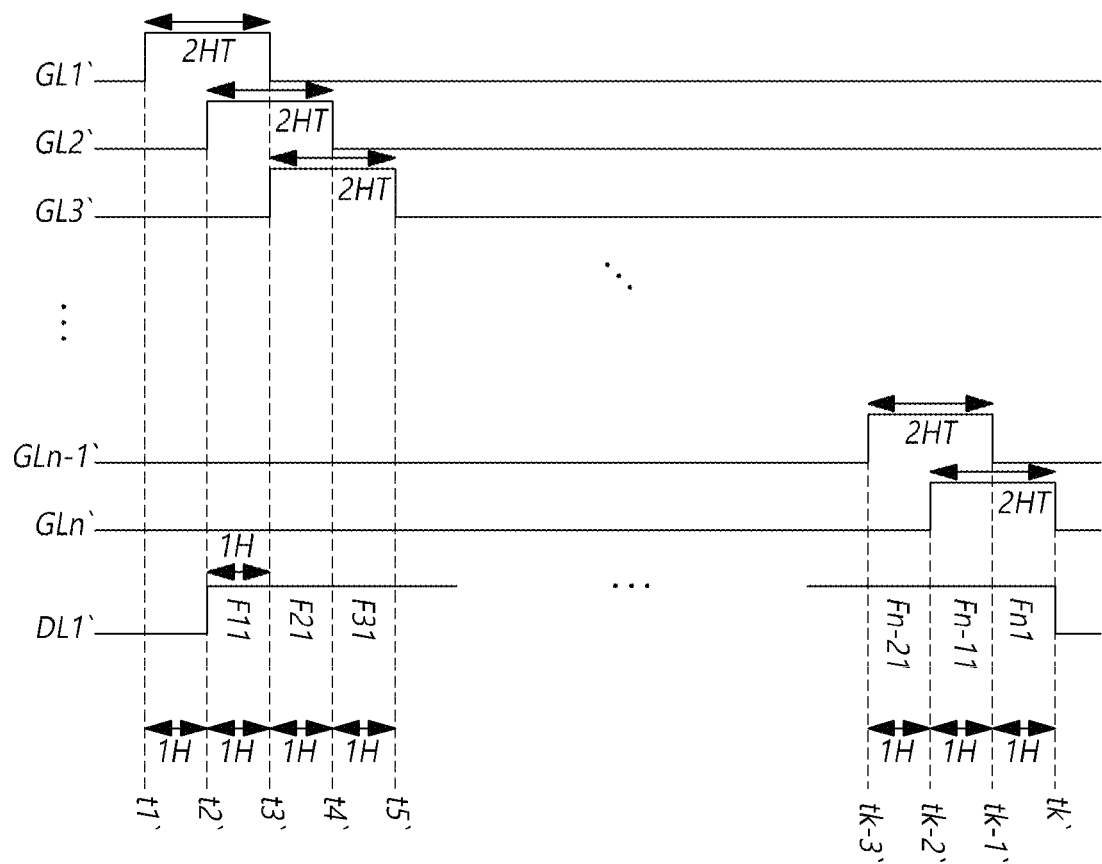
FIG. 5 is a diagram illustrating timing of driving of the display panel according to embodiments.

FIG. 5 is a diagram illustrating timing of driving of the display panel 410 according to embodiments.

The method of driving the display panel 410 to be described later may be referred to as a "general driving method."

The display panel 410 may be driven by the following method. First, a turn-on gate signal may be supplied sequentially to the plurality of gate lines GL'. When the turn-on gate signal is supplied to a specific gate line GL1', specific subpixels SP' electrically connected to the specific gate line GL1' may be supplied with a data voltage Vdata through data lines DL'. For example, when m number of data lines DL' are provided, the number of the specific subpixels SP' to which the turn-on gate signal is supplied may be m. In this case, the data voltage Vdata may be supplied to each of the m number of specific subpixels SP'. As the data voltage Vdata is supplied, the storage capacitor Cst included in the corresponding subpixel SP' may be charged. Afterwards, the emitting device ED may generate light using a charged voltage of the corresponding storage capacitor Cst.

The data voltage Vdata may be an image frame voltage F for expressing an image frame. Details of the image frame voltage F will later be provided along with description of FIG. 7.

Referring to FIG. 5, the plurality of gate lines GL' to which the turn-on gate signal is sequentially supplied may be viewed.

The turn-on gate signal may be supplied to a specific gate line GL' for a time period 2HT. The time period 2HT may be divided into a front end period and a rear end period of 1HT each.

The plurality of gate lines GL' may be operated by an overlapping method. For example, the overlapping method refers to a method in which when the turn-on gate signal is being supplied during the rear end period of the first gate line GL1', the turn-on gate signal is supplied during the front end period of the second gate line GL2'. That is, there is a period in which the supply of the turn-on gate signal to the first gate line GL1' and the supply of the turn-on gate signal to the second gate line GL2' overlap with each other. The supply of the turn-on gate signal to two gate lines GL' in an overlapping manner may be referred to as "overlap driving."

"Voltage free charging" technology may be realized through the overlap driving. When the voltage free charging method is not applied, the data voltage Vdata is supplied to specific subpixels SP' electrically connected to a specific gate line GL' only during the time period 1HT. Since the data voltage Vdata is required to be supplied for a limited time period, the data voltage Vdata may not be sufficiently stored in the storage capacitors Cst of the corresponding subpixels SP. In order to prevent this problem, "overlap driving" may be used. When the "overlap driving" is used, when the data voltage Vdata is supplied to some subpixels SP' electrically connected to a specific gate line GL', some subpixels SP' electrically connected to the second gate line GL2' may also be supplied with the data voltage Vdata in advance. In this manner, the problem in that the voltage is not sufficiently stored in the storage capacitor Cst may be overcome. That is, since the data voltage Vdata is supplied to some subpixels SP' electrically connected to the second gate line GL2' in advance, this may be referred to as "voltage free charging."

Referring to FIG. 5, the turn-on gate signal may be supplied to the first gate line GL1' from the first time point t1' to the third time point t3'.

As the turn-on gate signal is supplied to the first gate line GL1', the data voltage Vdata may be supplied to the specific subpixels SP' electrically connected to the first gate line GL1'. The data voltage Vdata may be supplied to the specific subpixels SP' through the data lines DL' electrically connected to the specific subpixels SP'.

Referring to FIG. 5, for example, the 11th subpixel SP11' electrically connected to the first gate line GL1' may be supplied with the data voltage Vdata through the first data line DL1'.

The data voltage Vdata supplied to the 11th subpixel SP11' may be an 11th image frame voltage F11. The 11th image frame voltage F11 may be supplied from a second time point t2' to the third time point t3'. In this case, depending on the design, the 11th image frame voltage F11 may be supplied from a time point slightly later than the second time point t2' to a time point slightly later than the third time point t3'.

Referring to FIG. 5, the turn-on gate signal may be supplied to the second gate line GL2' from the second time point t2' to a fourth time point t4'.

As the turn-on gate signal is supplied to the second gate line GL2', the data voltage Vdata may be supplied to the specific subpixels SP' electrically connected to the second gate line GL2'. The data voltage Vdata may be supplied to the specific subpixels SP' through the data lines DL' electrically connected to the specific subpixels SP'.

Referring to FIG. 5, for example, the 21st subpixel SP21' electrically connected to the second gate line GL2' may be supplied with the data voltage Vdata through the first data line DL1'.

The data voltage Vdata supplied to the 21st subpixel SP21' may be a 21st image frame voltage F21. The 21st image frame voltage F21 may be supplied from the third time point t3' to the fourth time point t4'. Here, the 21st image frame voltage F21 may be supplied from a time point slightly later than the third time point t3' to a time point slightly later than the fourth time point t4', depending on the design.

Referring to FIG. 5, the turn-on gate signal may be supplied to the third gate line GL3' from the third time point t3' to a fifth time point t5'.

As the turn-on gate signal is supplied to the third gate line GL3', the data voltage Vdata may be supplied to the specific subpixels SP' electrically connected to the third gate line GL3'. The data voltage Vdata may be supplied to the specific subpixels SP' through the data lines DL' electrically connected to the specific subpixels SP'.

Referring to FIG. 5, for example, the 31st subpixel SP31' electrically connected to the third gate line GL3' may be supplied with the data voltage Vdata through the first data line DL1'.

The data voltage Vdata supplied to the 31st subpixel SP31' may be a 31st image frame voltage F31. The 31st image frame voltage F31 may be supplied from the fourth time point t4' to the fifth time point t5'. Here, the 31st image frame voltage F31 may be supplied from a time point slightly later than the fourth time point t4' to a time point slightly later than the fifth time point t5', depending on the design.

Referring to FIG. 5, the turn-on gate signal may be supplied to an (n−1)th gate line GLn−1' from a (k−3)th time point tk−3' to a (k−1)th time point tk−1'.

As the turn-on gate signal is supplied to the (n−1)th gate line GLn−1', the data voltage Vdata may be supplied to specific subpixels SP' electrically connected to the (n−1)th gate line GLn−1'. The specific subpixels SP' may be supplied with the data voltage Vdata through the data lines DL' electrically connected to the specific subpixels SP'.

Referring to FIG. 5, for example, an (n−11)th subpixel SPn−11' electrically connected to the (n−1)th gate line GLn−1' may be supplied with the data voltage Vdata through the first data line DL1'.

The data voltage Vdata supplied to the (n−11)th subpixel SPn−11' may be an (n−11)th image frame voltage Fn−11. The (n−11)th image frame voltage Fn−11 may be supplied from a (k−2)th time point tk−2' to the (k−1)th time point tk−1'. Here, depending on the design, the (n−11)th image frame voltage Fn−11 may be supplied from a time point slightly later than the (k−2)th time point tk−2' to a time point slightly later than the (k−1)th time point tk−1'.

Referring to FIG. 5, the turn-on gate signal may be supplied to an nth gate line GLn' from the (k−2)th time point tk−2' to a kth time point tk'.

As the turn-on gate signal is supplied to the nth gate line GLn', the data voltage Vdata may be supplied to specific subpixels SP' electrically connected to the nth gate line GLn'. The specific subpixels SP' may be supplied with the data voltage Vdata through the data lines DL' electrically connected to the specific subpixels SP'.

Referring to FIG. 5, for example, the n1th subpixel SPnV' electrically connected to the nth gate line GLn' may be supplied with the data voltage Vdata through the first data line DL1'.

The data voltage Vdata supplied to the n1th subpixel SPnV' may be an n1th image frame voltage Fn1. The n1th image frame voltage Fn1 may be supplied from the (k−1)th time point tk−1' to the kth time point tk'. Here, depending on the design, the n1th image frame voltage Fn1 may be supplied from a time point slightly later than the (k−1)th time point tk−1' to a time point slightly later than the kth time point tk'.

Timing of driving of the display panel 410 for realizing an image frame has been described. A process of outputting a single image frame from the display panel 410 according to driving timing of the display panel 410 will be described.

Figure 6:
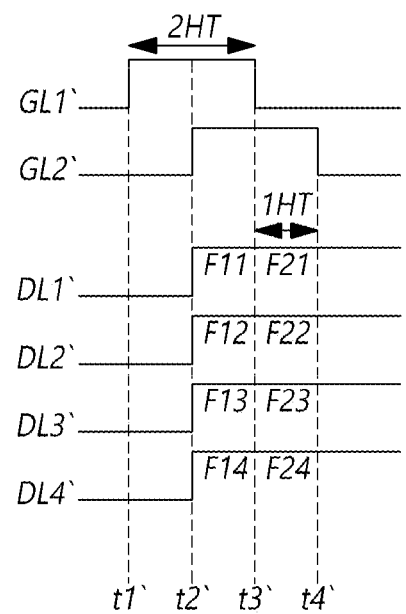
FIG. 6 is a diagram illustrating the timing of supply of a data voltage to first to fourth data lines.
Figure 7:
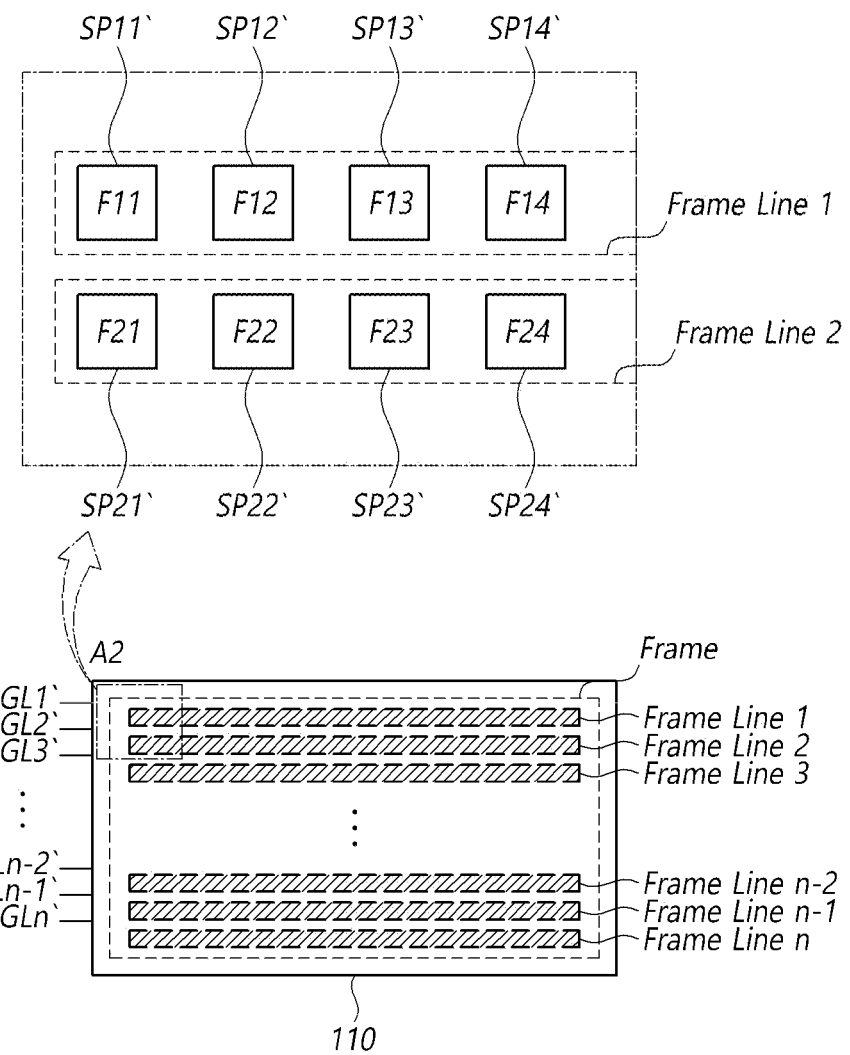
FIG. 7 is a diagram illustrating the timing of the display panel according to embodiments on which an image frame is expressed.

FIG. 6 is a diagram illustrating the timing of supply of a data voltage Vdata to first to fourth data lines DL1' to DL4'. FIG. 7 is a diagram illustrating the timing of the display panel 410 according to embodiments on which an image frame Frame is expressed.

The image frame Frame may be expressed as an image frame voltage F, i.e., the data voltage Vdata, which is supplied to the plurality of subpixels SP'. An image frame voltage F for expressing image frame lines will be described with reference to FIG. 6, and then the image frame Frame expressed by first to nth image frame lines Frame Line 1 to Frame Line n will be described with reference to FIG. 7.

An image frame voltage F for expressing the first image frame line Frame Line 1 may be supplied to each of subpixels SP' electrically connected to a first gate line GL'.

Referring to FIG. 6, the turn-on gate signal may be supplied to the first gate line GL1' from a first time point t1' to a third time point t3'. When the turn-on gate signal is supplied to the first gate line GL1', a data voltage Vdata may be supplied to a plurality of data lines DL' from a second time point t2' to the third time point t3'. That is, the data voltage Vdata may be supplied to some subpixels SP' electrically connected to the first gate line GL1'. For the convenience of explanation, the first to fourth data lines DL1' to DL4' will be taken as an example.

Referring to FIG. 6, the data voltage Vdata may be supplied to the first to fourth data lines DL1' to DL4' from the second time point t2' to the third time point t3'.

An 11th image frame voltage F11, i.e., a data voltage Vdata, may be supplied to the first data line DL1'. That is, the 11th image frame voltage F11 may be supplied to the 11th subpixel SP11'. Then, the 11th subpixel SP11' may generate light at a luminosity level corresponding to the 11th image frame voltage F11.

A 12th image frame voltage F12, i.e., a data voltage Vdata, may be supplied to the second data line DL2'. That is, the 12th image frame voltage F12 may be supplied to the 12th subpixel SP12'. Then, the 12th subpixel SP12' may generate light at a luminosity level corresponding to the 12th image frame voltage F12.

A 13th image frame voltage F13, i.e., a data voltage Vdata, may be supplied to the third data line DL3'. That is, the 13th image frame voltage F13 may be supplied to the 13th subpixel SP13'. Then, the 13th subpixel SP13' may generate light at a luminosity level corresponding to the 13th image frame voltage F13.

A 14th image frame voltage F14, i.e., a data voltage Vdata, may be supplied to the fourth data line DL4'. That is, the 14th image frame voltage F14 may be supplied to the 14th subpixel SP14'. Then, the 14th subpixel SP14' may generate light at a luminosity level corresponding to the 14th image frame voltage F14.

An image frame voltage F for expressing the second image frame line Frame Line 2 may be supplied to each of subpixels SP' electrically connected to the second gate line GL2'.

Referring to FIG. 6, the turn-on gate signal may be supplied to the second gate line GL2' from the second time point t2' to the fourth time point t4'. When the turn-on gate signal is supplied to the second gate line GL2', the data voltage Vdata may be supplied to the plurality of data lines DL' from the third time point t3' to a fourth time point t4'. That is, the data voltage Vdata may be supplied to some subpixels SP' electrically connected to the second gate line GL2'. For the convenience of explanation, the first to fourth data lines DL1' to DL4' will be taken as an example.

Referring to FIG. 6, the data voltage Vdata may be supplied to the first to fourth data lines DL1' to DL4' from the third time point t3' to the fourth time point t4'.

A 21st image frame voltage F21, i.e., a data voltage Vdata, may be supplied to the first data line DL1'. That is, the 21st image frame voltage F21 may be supplied to the 21st subpixel SP21'. Then, the 21st subpixel SP21' may generate light at a luminosity level corresponding to the 21st image frame voltage F21.

A 22nd image frame voltage F22, i.e., a data voltage Vdata, may be supplied to the second data line DL2'. That is, the 22nd image frame voltage F22 may be supplied to the 22nd subpixel SP22'. Then, the 22nd subpixel SP22' may generate light at a luminosity level corresponding to the 22nd image frame voltage F22.

A 23rd image frame voltage F23, i.e., a data voltage Vdata, may be supplied to the third data line DL3'. That is, the 23rd image frame voltage F23 may be supplied to the 23rd subpixel SP23'. Then, the 23rd subpixel SP23' may generate light at a luminosity level corresponding to the 23rd image frame voltage F23.

A 24th image frame voltage F24, i.e., a data voltage Vdata, may be supplied to the fourth data line DL4'. That is, the 24th image frame voltage F24 may be supplied to the 24th subpixel SP24'. Then, the 24th subpixel SP24' may generate light at a luminosity level corresponding to the 24th image frame voltage F24.

After the image frame voltage F is supplied to the subpixels SP' electrically connected to the second gate line GL2', the above-described operations are repeated. Thus, even subpixels SP' electrically connected to the nth gate line GLn' may be supplied with the image frame voltage F.

The image frame voltage F supplied to a plurality of subpixels SP' has been described with reference to FIG. 6. The display panel 410 outputting an image frame Frame in response to an image frame voltage F will be described with reference to FIG. 7.

Referring to FIG. 7, a single image frame Frame may be output through the display panel 410. As different image frames Frame are sequentially output through the display panel 410, a still image or a video image may be realized.

As the plurality of subpixels SP' disposed in the display panel 410 generate light, a single image frame Frame may be output. The plurality of subpixels SP' disposed side by side in row and column directions may generate light at a luminosity level corresponding to the image frame voltage F.

When each of the plurality of subpixels SP' is assumed to be a point, the image frame Frame may be expressed by generating light from a plurality of points arranged in a matrix pattern. When the plurality of points arranged in a matrix pattern are grouped in the row direction, a single image frame Frame may be expressed by a group of image frame lines grouped in the row direction. That is, the single image frame Frame may be expressed by a plurality of image frame lines, i.e., first to nth image frame lines Frame Line 1 to Frame Line n.

An image frame voltage F for expressing an ath image frame line Frame Line a may be expressed as an ath image frame voltage Fa. For example, a first image frame voltage F1 may correspond to the first image frame line Frame Line 1, and a second image frame voltage F2 may correspond to the second image frame line Frame Line 2.

When the ath image frame voltage Fa is supplied to m number of data lines DL, the image frame voltage F may be expressed as an amth image frame voltage Fam. For example, the 11th image frame voltage F11 may be an image frame voltage F supplied to a first data line DL1 in order to express the first image frame line Frame Line 1. For example, an (n+13)th image frame voltage Fn+13 may be an image frame voltage F supplied to a third data line DL3 in order to express an (n+1)th image frame line Frame Line n+1.

Referring to FIG. 7, it may be viewed that a single image frame Frame is expressed as the first to nth image frame lines Frame Line 1 to Frame Line n through the display panel 410.

Referring to FIG. 7, area A2 of the area of the display panel 410 may be viewed. The image frame lines may be expressed by generating light from the subpixels SP' disposed on the same rows as the corresponding image frame lines. For the convenience of explanation, the characteristics of the image frame lines may be described by referring to the plurality of subpixels SP disposed in the area A2.

Referring to FIG. 7, it may be viewed that the first image frame line Frame Line 1 and the second image frame line Frame Line 2 are expressed in the area A2.

The first image frame line Frame Line 1 may be expressed by generating light from the subpixels SP' electrically connected to the first gate line GL1'. Referring to FIG. 7, the first gate line GL1' may be electrically connected to the 11th subpixel SP11', the 12th subpixel SP12', the 13th subpixel SP13', and the 14th subpixel SP14'.

The 11th subpixel SP11' may generate light at a luminosity level corresponding to the 11th image frame voltage F11.

The 12th subpixel SP12' may generate light at a luminosity level corresponding to the 12th image frame voltage F12.

The 13th subpixel SP13' may generate light at a luminosity level corresponding to the 13th image frame voltage F13.

The 14th subpixel SP14' may generate light at a luminosity level corresponding to the 14th image frame voltage F14.

The 11th subpixel SP11', the 12th subpixel SP12', the 13th subpixel SP13', and the 14th subpixel SP14' may be disposed side by side in the row direction. As the 11th subpixel SP11', the 12th subpixel SP12', the 13th subpixel SP13', and the 14th subpixel SP14' generate light, the first image frame line Frame Line 1 may be expressed.

The second image frame line Frame Line 2 may be expressed by generating light from the subpixels SP' electrically connected to the second gate line GL2'. Referring to FIG. 7, the second gate line GL2' may be electrically connected to the 21st subpixel SP21', the 22nd subpixel SP22', the 23rd subpixel SP23', and the 24th subpixel SP24'.

The 21st subpixel SP21' may generate light at a luminosity level corresponding to the 21st image frame voltage F21.

The 22nd subpixel SP22' may generate light at a luminosity level corresponding to the 22nd image frame voltage F22.

The 23rd subpixel SP23' may generate light at a luminosity level corresponding to the 23rd image frame voltage F23.

The 24th subpixel SP24' may generate light at a luminosity level corresponding to the 24th image frame voltage F24.

The 21st subpixel SP21', the 22nd subpixel SP22', the 23rd subpixel SP23', and the 24th subpixel SP24' are disposed side by side in the row direction. As the 21st subpixel SP21', the 22nd subpixel SP22', the 23rd subpixel SP23', and the 24th subpixel SP24' generate light, the second image frame line Frame Line 2 may be expressed.

In other words, the first image frame line Frame Line 1 may be expressed by generating light from the subpixels SP' electrically connected to the first gate line GL1'. The second image frame line Frame Line 2 may be expressed by generating light from the subpixels SP' electrically connected to the second gate line GL2'. As the above-described operations are repeated, the nth image frame line Frame Line n may be expressed by generating light from the subpixels SP' electrically connected to the nth gate line GLn'. As the first to nth image frame lines Frame Line 1 to Frame Line n are expressed, a single image frame Frame may be expressed using the display panel 410.

Since the plurality of subpixels SP' illustrated in FIG. 4 are disposed in a matrix pattern, the plurality of subpixels SP' may be referred to as "a matrix pattern of subpixels."

The method of driving matrix type subpixels has been described with reference to FIGS. 4 to 7. Hereinafter, a method of driving a zigzag pattern of subpixels having a different structure from the matrix pattern of subpixels will be described.

FIG. 8 is a diagram illustrating a zigzag pattern of a plurality of subpixels SP disposed in the display panel 810 according to embodiments.

Referring to FIG. 8, the plurality of subpixels SP may be disposed in the display panel 810. Referring to FIG. 8, area B1 of the area of the display panel 810 may be viewed. The plurality of subpixels SP may be disposed in a zigzag pattern. The zigzag pattern refers to a pattern in which specific figures repeated in a vertical direction or repeated in a horizontal direction. For example, a pattern in which figures are repeated in the shape of W may be referred to as the zigzag pattern. Alternatively, a pattern in which figures are repeated in the shape of Z may be referred to as the zigzag pattern. In another example, a pattern such as "- -_ _- -_ _- -_ _" may be referred to as a zigzag pattern. Although the pattern in which the subpixels SP are disposed has been defined as being "zigzag," the "zigzag" pattern may include any pattern similar to a typical zigzag pattern.

The characteristics in which the plurality of subpixels SP are disposed in a zigzag pattern will be described by referring to the plurality of subpixels SP disposed in the area B1 for the convenience of explanation.

A plurality of subpixels SP' may include an ijth subpixel SPij. Here, i may indicate a row in which the subpixel SP is disposed, and j may indicate a column in which the subpixel SP is disposed. Hereinafter, the subpixel SP may be defined as the form of the ijth subpixel SPij. Referring to FIG. 8, the plurality of subpixels SP may include the 11th to 34th subpixels SP11 to SP34.

Each of the plurality of subpixels SP may include the circuit portion SP_c and the open area SP_e.

The plurality of subpixels SP may be electrically connected to a plurality of data lines DL and a plurality of gate lines GL.

The plurality of data lines DL and the plurality of gate lines GL may be disposed such that the plurality of data lines DL intersect the plurality of gate lines GL. The plurality of data lines DL may be disposed to respectively extend in the column direction and may be disposed side by side in the row direction. The plurality of gate lines GL may be disposed to respectively extend in the row direction and may be disposed side by side in the column direction. Hereinafter, an expression "upward direction" or "downward direction" with respect to the column direction may be used. An expression "left" or "right" with respect to the row direction may also be used.

The first data line DL1 may be electrically connected to the 11th subpixel SP11, the 21st subpixel SP21, and the 31st subpixel SP31. The subpixels SP electrically connected to the first data line DL1 may be disposed side by side in the column direction.

The second data line DL2 may be electrically connected to the 12th subpixel SP12, the 22nd subpixel SP22, and the 32nd subpixel SP32. The subpixels SP electrically connected to the second data line DL2 may be disposed side by side in the column direction.

The third data line DL3 may be electrically connected to the 13th subpixel SP13, the 23rd subpixel SP23, and the 33rd subpixel SP33. The subpixels SP electrically connected to the third data line DL3 may be disposed side by side in the column direction.

The fourth data line DL4 may be electrically connected to the 14th subpixel SP14, the 24th subpixel SP24, and the 34th subpixel SP34. The subpixels SP electrically connected to the fourth data line DL4 may be disposed side by side in the column direction.

The first gate line GL1 may be electrically connected to the 11th subpixel SP11, the 12th subpixel SP12, the 13th subpixel SP13, and the 14th subpixel SP14. The subpixels SP electrically connected to the first gate line GL1 may be disposed in a zigzag pattern.

Referring to FIG. 8, when m is assumed to be a natural number equal to or greater than 1, the open area SP_e of a subpixel SP disposed in the (4m−3)th column among the subpixels SP electrically connected to the first gate line GL1 may be disposed in the upward direction of the first gate line GL1. The open area SP_e of a subpixel SP disposed in the (4m−2)th column among the subpixels SP electrically connected to the first gate line GL1 may be disposed in the upward direction of the first gate line GL1. The open area SP_e of a subpixel SP disposed in the (4m−1)th column among the subpixels SP electrically connected to the first gate line GL1 may be disposed in the downward direction of the first gate line GL1. The open area SP_e of a subpixel SP disposed in the 4mth column among the subpixels SP electrically connected to the first gate line GL1 may be disposed in the downward direction of the first gate line GL1.

Referring to FIG. 8, the open area SP_e of the 11th subpixel SP11 and the open area SP_e of the 12th subpixel SP12 may be disposed in the upward direction of the first gate line GL1, and the circuit portion SP_c of the 11th subpixel SP11 and the circuit portion SP_c of the 12th subpixel SP12 may be disposed in the downward direction of the first gate line GL1. The open area SP_e of the 13th subpixel SP13 and the open area SP_e of the 14th subpixel SP14 may be disposed in the downward direction of the first gate line GL1, and the circuit portion SP_c of the 13th subpixel SP13 and the circuit portion SP_c of the 14th subpixel SP14 may be disposed in the upward direction of the first gate line GL1.

The second gate line GL2 may be electrically connected to the 21st subpixel SP21, the 22nd subpixel SP22, the 23rd subpixel SP23, and the 24th subpixel SP24. The subpixels SP electrically connected to the second gate line GL2 may be disposed in a zigzag pattern.

Referring to FIG. 8, when m is assumed to be a natural number equal to or greater than 1, the open area SP_e of a subpixel SP disposed in the (4m−3)th column among the subpixels SP electrically connected to the second gate line GL2 may be disposed in the upward direction of the second gate line GL2. The open area SP_e of a subpixel SP disposed in the (4m−2)th column among the subpixels SP electrically connected to the second gate line GL2 may be disposed in the upward direction of the second gate line GL2. The open area SP_e of a subpixel SP disposed in the (4m−1)th column among the subpixels SP electrically connected to the second gate line GL2 may be disposed in the downward direction of the second gate line GL2. The open area SP_e of a subpixel SP disposed in the 4mth column among the subpixels SP electrically connected to the second gate line GL2 may be disposed in the downward direction of the second gate line GL2.

Referring to FIG. 8, the open area SP_e of the 21st subpixel SP21 and the open area SP_e of the 22nd subpixel SP22 may be disposed in the upward direction of the second gate line GL2, and the circuit portion SP_c of the 21st subpixel SP21 and the circuit portion SP_c of the 22nd subpixel SP22 may be disposed in the downward direction of the second gate line GL2. The open area SP_e of the 23rd subpixel SP23 and the open area SP_e of the 24th subpixel SP24 may be disposed in the downward direction of the second gate line GL2, and the circuit portion SP_c of the 23rd subpixel SP23 and the circuit portion SP_c of the 24th subpixel SP24 may be disposed in the upward direction of the second gate line GL2.

The third gate line GL3 may be electrically connected to the 31st subpixel SP31, the 32nd subpixel SP32, the 33rd subpixel SP33, and the 34th subpixel SP34. The subpixels SP electrically connected to the third gate line GL3 may be disposed in a zigzag pattern.

Referring to FIG. 8, when m is assumed to be a natural number equal to or greater than 1, the open area SP_e of a subpixel SP disposed in the (4m−3)th column among the subpixels SP electrically connected to the third gate line GL3 may be disposed in the upward direction of the third gate line GL3. The open area SP_e of a subpixel SP disposed in the (4m−2)th column among the subpixel SP electrically connected to the third gate line GL3 may be disposed in the upward direction of the third gate line GL3. The open area SP_e of a subpixel SP disposed in the (4m−1)th column among the subpixel SP electrically connected to the third gate line GL3 may be disposed in the downward direction of the third gate line GL3. The open area SP_e of a subpixel SP disposed in the 4mth column among the subpixel SP electrically connected to the third gate line GL3 may be disposed in the downward direction of the third gate line GL3.

Referring to FIG. 8, the open area SP_e of the 31st subpixel SP31 and the open area SP_e of the 32nd subpixel SP32 may be disposed in the upward direction of the third gate line GL3, the circuit portion SP_c of the 31st subpixel SP31 and the circuit portion SP_c of the 32nd subpixel SP32 may be disposed in the downward direction of the third gate line GL3. The open area SP_e of the 33rd subpixel SP33 and the open area SP_e of the 34th subpixel SP34 may be disposed in the downward direction of the third gate line GL3, and the circuit portion SP_c of the 33rd subpixel SP33 and the circuit portion SP_c of the 34th subpixel SP34 may be disposed in the upward direction of the third gate line GL3.

Although it has been described above that the positions of the open areas alternate in the upward direction and the downward direction by two respective subpixels SP, the position of the open area may alternate in the upward direction and the downward direction by every single subpixel SP. Alternatively, the position of the open area may alternate in the upward direction and the downward direction by every two or more subpixels SP. With changes in the number of subpixels SP by which the positions of the open areas of the subpixels alternate, the following description should be interpreted on this basis.

Figure 9:
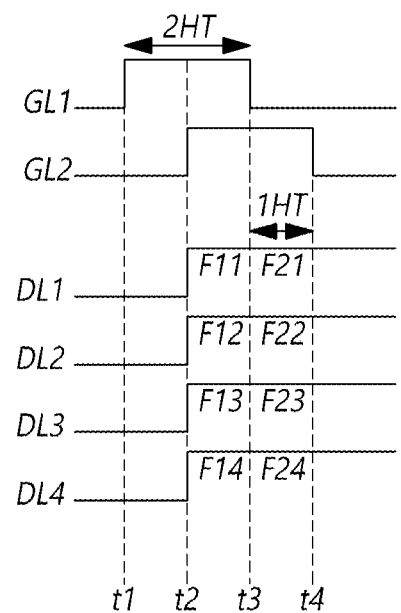
FIG. 9 is a diagram illustrating the timing of supply of a data voltage to the first to fourth data lines according to embodiments.
Figure 10:
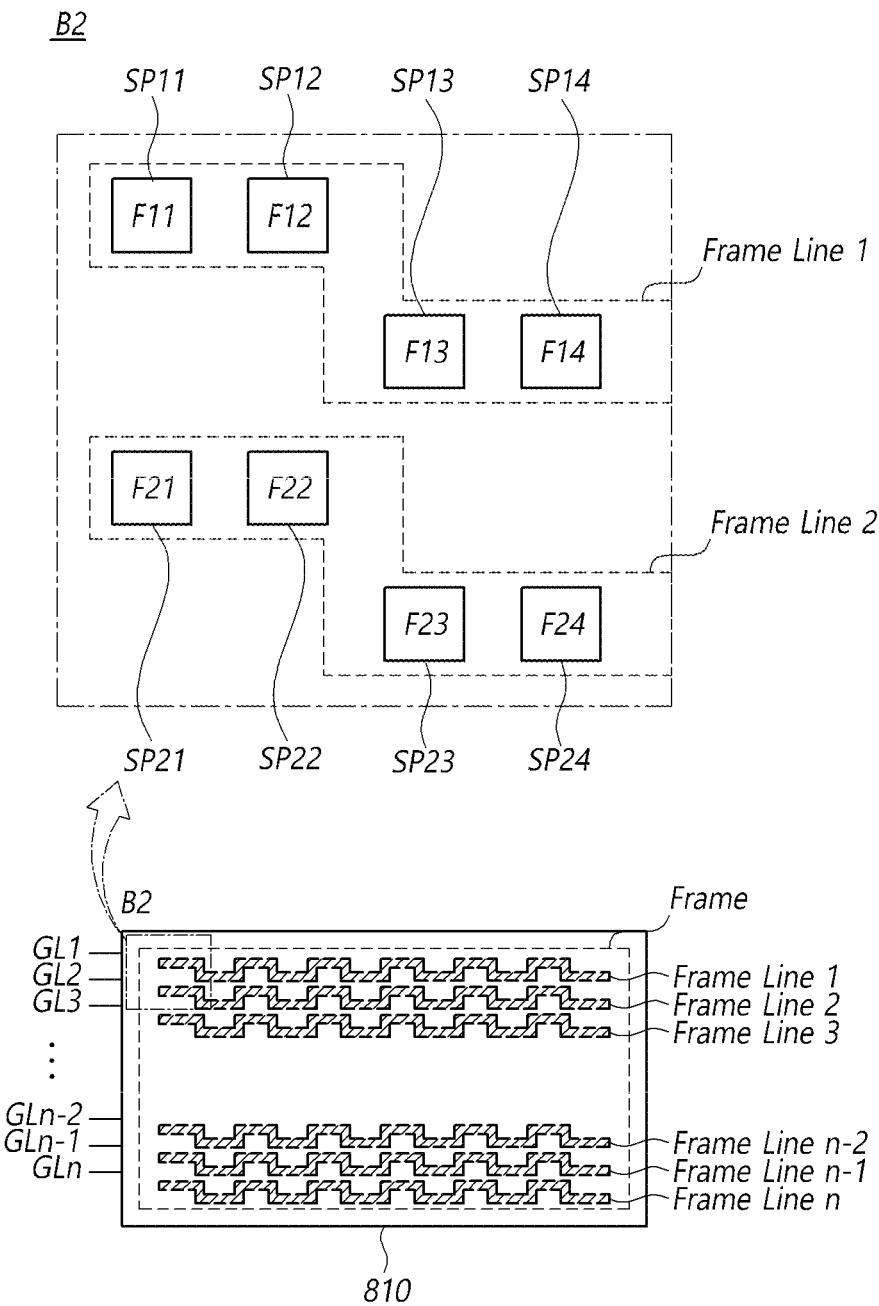
FIG. 10 is a diagram illustrating the display panel according to embodiments on which an image frame is expressed.

FIG. 9 is a diagram illustrating the timing of supply of a data voltage Vdata to the first to fourth data lines DL1 to DL4 according to embodiments. FIG. 10 is a diagram illustrating the display panel 810 according to embodiments on which an image frame Frame is expressed.

The features of the timing of supply of the data voltage Vdata illustrated in FIG. 9 are the same as those of the timing of supply of the data voltage Vdata illustrated in FIG. 6.

Referring to FIG. 9, the turn-on gate signal may be supplied to the first gate line GL1 from a first time point t1 to a third time point t3. When the turn-on gate signal is supplied to the first gate line GL1, a data voltage Vdata may be supplied to a plurality of data lines DL from a second time point t2 to the third time point t3. An 11th image frame voltage F11, i.e., a data voltage Vdata, may be supplied to the first data line DL1. A 12th image frame voltage F12, i.e., a data voltage Vdata, may be supplied to the second data line DL2. A 13th image frame voltage F13, i.e., a data voltage Vdata, may be supplied to the third data line DL3. A 14th image frame voltage F14, i.e., a data voltage Vdata, may be supplied to the fourth data line DL4.

Referring to FIG. 9, the turn-on gate signal may be supplied to the second gate line GL2 from the second time point t2 to a fourth time point t4. When the turn-on gate signal is supplied to the second gate line GL2, the data voltage Vdata may be supplied to the plurality of data lines DL from the third time point t3 to the fourth time point t4. A 21st image frame voltage F21, i.e., a data voltage Vdata, may be supplied to the first data line DL1. A 22nd image frame voltage F22, i.e., a data voltage Vdata, may be supplied to the second data line DL2. A 23rd image frame voltage F23, i.e., a data voltage Vdata, may be supplied to the third data line DL3. A 24th image frame voltage F24, i.e., a data voltage Vdata, may be supplied to the fourth data line DL4.

Referring to FIG. 10, a single image frame Frame may be output through the display panel 810. Referring to FIG. 10, it may be viewed that a single image frame Frame is expressed on the display panel 810 using first to nth image frame lines Frame Line 1 to Frame Line n.

Referring to FIG. 10, area B2 of the area of the display panel 810 may be viewed. Image frame lines may be expressed by generating light from subpixels SP in positions corresponding to the corresponding image frame line Frame Line. For the convenience of explanation, the features of the image frame lines will be described through the plurality of subpixels SP disposed in the area B2.

Referring to FIG. 10, it may be viewed that the first image frame line Frame Line 1 and the second image frame line Frame Line 2 are expressed in the area B2.

The first image frame line Frame Line 1 may be expressed by generating light from the subpixels SP electrically connected to the first gate line GL1. Referring to FIG. 10, the first gate line GL1 may be electrically connected to the 11th subpixel SP11, the 12th subpixel SP12, the 13th subpixel SP13, and the 14th subpixel SP14.

The 11th subpixel SP11 may generate light at a luminosity level corresponding to the 11th image frame voltage F11.

The 12th subpixel SP12 may generate light at a luminosity level corresponding to the 12th image frame voltage F12.

The 13th subpixel SP13 may generate light at a luminosity level corresponding to the 13th image frame voltage F13.

The 14th subpixel SP14 may generate light at a luminosity level corresponding to the 14th image frame voltage F14.

The 11th subpixel SP11, the 12th subpixel SP12, the 13th subpixel SP13, and the 14th subpixel SP14 are disposed in a zigzag pattern as illustrated in FIG. 8. As the 11th subpixel SP11, the 12th subpixel SP12, the 13th subpixel SP13, and the 14th subpixel SP14 generate light, the first image frame line Frame Line 1 may be expressed in a zigzag pattern.

The second image frame line Frame Line 2 may be expressed by generating light from the subpixels SP electrically connected to the second gate line GL2. Referring to FIG. 10, the second gate line GL2 may be electrically connected to the 21st subpixel SP21, the 22nd subpixel SP22, the 23rd subpixel SP23, and the 24th subpixel SP24.

The 21st subpixel SP21 may generate light at a luminosity level corresponding to the 21st image frame voltage F21.

The 22nd subpixel SP22 may generate light at a luminosity level corresponding to the 22nd image frame voltage F22.

The 23rd subpixel SP23 may generate light at a luminosity level corresponding to the 23rd image frame voltage F23.

The 24th subpixel SP24 may generate light at a luminosity level corresponding to the 24th image frame voltage F24.

The 21st subpixel SP21, the 22nd subpixel SP22, the 23rd subpixel SP23, and the 24th subpixel SP24 are disposed in a zigzag pattern as illustrated in FIG. 8. As the 21st subpixel SP21, the 22nd subpixel SP22, the 23rd subpixel SP23, and the 24th subpixel SP24 generate light, the second image frame line Frame Line 2 may be expressed in a zigzag pattern.

In other words, the first image frame line Frame Line 1 may be expressed by generating light from the subpixels SP electrically connected to the first gate line GL1. The second image frame line Frame Line 2 may be expressed by generating light from the subpixels SP electrically connected to the second gate line GL2. As the above-described operations are repeated, the nth image frame line Frame Line n may be expressed by generating light from the subpixels SP electrically connected to the nth gate line GLn. As the first to nth image frame lines Frame Line 1 to Frame Line n are expressed, a single image frame may be expressed from the display panel 810.

However, since a single image frame is expressed by subpixels SP disposed in a zigzag pattern, the readability of subpixels having a zigzag pattern may be rather lower than that of subpixels having a matrix pattern. Hereinafter, a problem in that readability is reduced when the display panel 810 is driven by the "typical driving method" illustrated in FIG. 5 will be described.

Figure 11C:
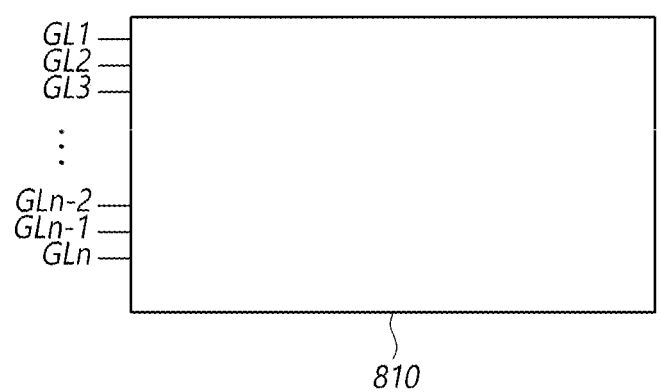

FIGS. 11A to 11C are diagrams illustrating a first open area distance difference D1 between subpixels SP disposed in a zigzag pattern according to embodiments. FIGS. 12A to 12C are diagrams illustrating a second open area distance difference D2 between subpixels SP disposed in a zigzag pattern according to embodiments.

Referring to FIG. 11A, area B1 of the area of the display panel 810 may be viewed. It may be viewed that a plurality of subpixels SP are disposed in a zigzag pattern in the area B1.

The features of the display panel 810 illustrated in FIG. 11A are the same as the features of the display panel 810 illustrated in FIG. 8.

Referring to FIG. 11A, the first image frame line Frame Line 1 may be expressed by generating light from the 11th subpixel SP11, the 12th subpixel SP12, the 13th subpixel SP13, and the 14th subpixel SP14.

Since the plurality of subpixels SP are disposed in a zigzag pattern, the first image frame line Frame Line 1 is expressed in a zigzag pattern. The open area SP_e of the 11th subpixel SP11 and the open area SP_e of the 12th subpixel SP12 are disposed in the upward direction of the first gate line GL1. A line connecting the central point of the open area SP_e of the 11th subpixel SP11 and the central point of the open area SP_e of the 12th subpixel SP12 may be referred to as an 11th centerline m11. The open area SP_e of the 13th subpixel SP13 and the open area SP_e of the 14th subpixel SP14 are disposed in the downward direction of the first gate line GL1. A line connecting the central point of the open area SP_e of the 13th subpixel SP13 and the central point of the open area SP_e of the 14th subpixel SP14 may be referred to as a 12th centerline m12. The distance difference between the 11th centerline m11 and the 12th centerline m12 may be referred to as the first open area distance difference D1.

With decreases in the first open area distance difference D1, the readability of the image frame Frame output from the display device 100 may be improved.

In other words, when the display panel 810 is driven by the "typical driving method" illustrated in FIG. 5, there is the first open area distance difference D1, and readability may be improved by reducing the first open area distance difference D1. Hereinafter, a method for improving readability will be described.

Referring to FIG. 12A, area C1 of a display panel 1210 may be viewed. It may be viewed that a plurality of subpixels SP having a zigzag pattern are disposed in the area C1.

Referring to FIGS. 11C and 12C, n number of gate lines GL are disposed in the display panel 810 illustrated in FIG. 11C, while n+1 number of gate lines GL are disposed in the display panel 1210 illustrated in FIG. 12C. Except for the number of the gate lines GL, the features of the display panel 810 illustrated in FIG. 11C and the features of the display panel 1210 illustrated in FIG. 12C may be the same. That is, the features of the structure in which subpixels SP electrically connected to the first to nth gate lines GL1 to GLn are disposed in the display panel 1210 may be the same as the features of the arrangement of the subpixels SP of the display panel 810 illustrated in FIG. 11C.

Subpixels SP may be electrically connected to the (n+1)th gate line GLn+1. The subpixels SP electrically connected to the (n+1)th gate line GLn+1 may be disposed in a zigzag pattern like subpixels SP electrically connected to the remaining gate lines GL. For example, referring to FIG. 12B, when n is assumed to be 6, a seventh gate line GL7 illustrated in FIG. 12B may be the (n+1)th gate line GLn+1.

In addition, since the plurality of gate lines GL include the n+1 number of gate lines GL, methods of driving a display device in which a plurality of gate lines GL include n number of gate lines GL may be applied to the display device 100.

Referring to FIG. 12A, the first image frame line Frame Line 1 may be expressed by generating light from subpixels SP in which the open area SP_e is disposed in the downward direction of the first gate line GL1 and subpixels SP in which the open area SP_e is disposed in the upward direction of the second gate line GL2.

The open area SP_e of the 13th subpixel SP13 and the open area SP_e of the 14th subpixel SP14 are disposed in the downward direction of the first gate line GL1. A line connecting the central point of the open area SP_e of the 13th subpixel SP13 and the central point of the open area SP_e of the 14th subpixel SP14 may be referred to as a 21st centerline m21. The open area SP_e of the 21st subpixel SP21 and the open area SP_e of the 22nd subpixel SP22 are disposed in the upward direction of the second gate line GL2. A line connecting the central point of the open area SP_e of the 21st subpixel SP21 and the central point of the open area SP_e of the 22nd subpixel SP22 may be referred to as a 22nd centerline m22. The distance difference between the 21st centerline m21 and the 22nd centerline m22 may be referred to as a second open area distance difference D2.

Referring to FIGS. 11A and 12A, the second open area distance difference D2 is smaller than the first open area distance difference D1. That is, it may be viewed that the first open area distance difference D1 of the first image frame line Frame Line 1 is improved to be the second open area distance difference D2 of the first image frame line Frame Line 1.

In order to explain FIG. 11A in an illustrative manner, areas in which the first to sixth image frame lines Fame Line 1 to Frame Line 6 generate light are illustrated in FIG. 11B. In order to explain FIG. 12A in an illustrative manner, areas in which the first to sixth image frame lines Fame Line 1 to Frame Line 6 generate light are illustrated in FIG. 12B. The image frame Frame may be expressed by image frame lines Frame Line greater than 6 image frame lines Frame Line.

Referring to FIGS. 11B and 12B, the areas in which the first to sixth image frame lines Fame Line 1 to Frame Line 6 generate light may be viewed. Referring to FIG. 11B, the first open area distance difference D1 of each of the first to sixth image frame lines Fame Line 1 to Frame Line 6 may be viewed. In addition, referring to FIG. 12B, the second open area distance difference D2 of each of the first to sixth image frame lines Fame Line 1 to Frame Line 6 may be viewed.

Referring to FIGS. 11B and 12B, the second open area distance difference D2 is smaller than the first open area distance difference D1. That is, it may be viewed that the first open area distance difference D1 of the first image frame line Frame Line 1 is improved to be the second open area distance difference D2 of the first image frame line Frame Line 1.

In other words, embodiments of the present disclosure may provide the display device 100 and the driving method thereof in which readability is improved.

n number of gate lines GL may be disposed in the display panel 810 illustrated in FIG. 11C. In contrast, n+1 number of gate lines GL may be disposed in the display panel 1210 illustrated in FIG. 12C. For example, the number of gate lines for image driving may be 2160 for a UHD resolution of 2160*3840. In this case, 2160 gate lines GL may be disposed in the display panel 810 illustrated in FIG. 11C, while 2161 gate lines GL may be disposed in the display panel 1210 illustrated in FIG. 12C. The same may be applied for a UHD resolution of 720*1280 and an FHD resolution of 1080*1920.

Subpixels SP may be electrically connected to the (n+1)th gate line GLn+1. The subpixels SP electrically connected to the (n+1)th gate line GLn+1 may be disposed in a zigzag pattern like subpixels SP electrically connected to the remaining gate lines GL.

According to the features of the display panel 1210 illustrated in FIG. 12C in which one gate line GL is added compared to the display panel 810 illustrated in FIG. 11C and the timing of driving of the display panel 1210, the readability of the display panel 1210 may be improved.

According to the features of the display panel 1210 in which one gate line GL is added and the features of the timing of driving of the display panel 1210, some subpixels SP electrically connected to the first gate line GL1 may not generate light or express black, and some subpixels SP electrically connected to the (n+1)th gate line GLn+1 may not generate light or glow black. The above-described features are some features of the method of driving the display device 100 for improving readability, and a detailed description will be provided later.

That is, embodiments of the present disclosure may provide the display device 100 and the driving method thereof in which readability is improved.

Embodiments of the present disclosure may provide the display device 100 and the driving method thereof in which low power driving is enabled due to improved readability.

Hereinafter, the method of driving the display device 100 in which readability may be improved will be described in detail.

Figure 13:
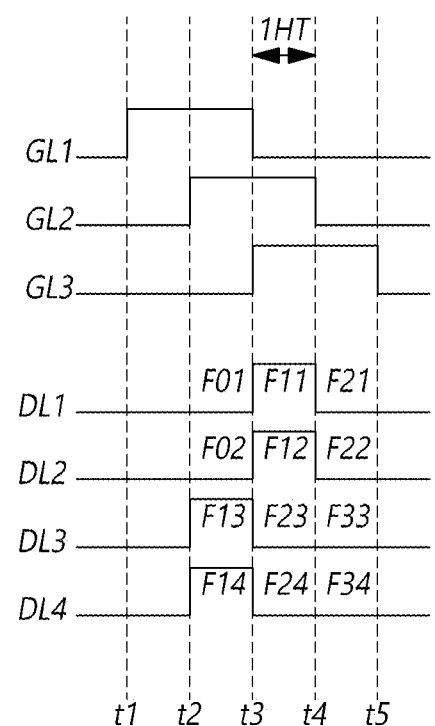
FIG. 13 is a diagram illustrating the timing of a data voltage supplied to data lines to express the first image frame line according to embodiments.

FIG. 13 is a diagram illustrating the timing of a data voltage Vdata supplied to data lines DL to express the first image frame line Frame Line 1 according to embodiments.

Referring to FIG. 13, a first image frame line Frame Line 1 may be expressed by generating light from some subpixels SP electrically connected to a first gate line GL1 and some subpixels SP electrically connected to a second gate line GL2. For the convenience of explanation, first to fourth data lines DL1 to DL4 will be taken as an example.

Referring to FIG. 13, the turn-on gate signal may be supplied to the first gate line GL1 from a first time point t1 to a third time point t3. When the turn-on gate signal is supplied to the first gate line GL1, the data voltage Vdata may be supplied to data lines DL from a second time point t2 to the third time point t3. When m is assumed to be a natural number equal to or greater than 1, an image frame voltage F for expressing the first image frame line Frame Line 1 may be supplied to a data line DL corresponding to a (4m−1)th column. The image frame voltage F for expressing the first image frame line Frame Line 1 may be supplied to a data line DL corresponding to 4mth column. For example, referring to FIG. 13, a 13th image frame voltage F13 may be supplied to the third data line DL3, and a 14th image frame voltage F14 may be supplied to the fourth data line DL4.

Referring to FIG. 13, the turn-on gate signal may be supplied to the second gate line GL2 from the second time point t2 to a fourth time point t4. When the turn-on gate signal is supplied to the second gate line GL2, the data voltage Vdata may be supplied to the data lines DL from the third time point t3 to the fourth time point t4. When m is assumed to be a natural number equal to or greater than 1, the image frame voltage F for expressing the first image frame line Frame Line 1 may be supplied to a data line DL corresponding to the (4m−3)th column. The image frame voltage F for expressing the first image frame line Frame Line 1 may be supplied to a data line DL corresponding to the (4m−2)th column. For example, referring to FIG. 13, an 11th image frame voltage F11 may be supplied to the first data line DL1, and a 12th image frame voltage F12 may be supplied to the second data line DL2.

The first image frame line Frame Line 1 may be expressed on the basis of the data voltage Vdata supplied from the second time point t2 to the third time point t3 and the data voltage Vdata supplied from the third time point t3 to the fourth time point t4. In contrast, when the display panel 810 is driven by the typical driving method illustrated in FIG. 5, the first image frame line Frame Line 1 may be expressed on the basis of the data voltage Vdata supplied during the same period. When the timing of supply of the typical driving method illustrated in FIG. 5 and the timing of supply of the data voltage Vdata illustrated in FIG. 13 are compared, the timing of the driving illustrated in FIG. 13 may be expressed on the basis of the data voltage Vdata supplied during 2HT of the front end period and 2HT of the rear end period. The features of the timing of supply of the data voltage Vdata illustrated in FIG. 13 may be referred to as a "1HT delayed supply method."

Figure 14:
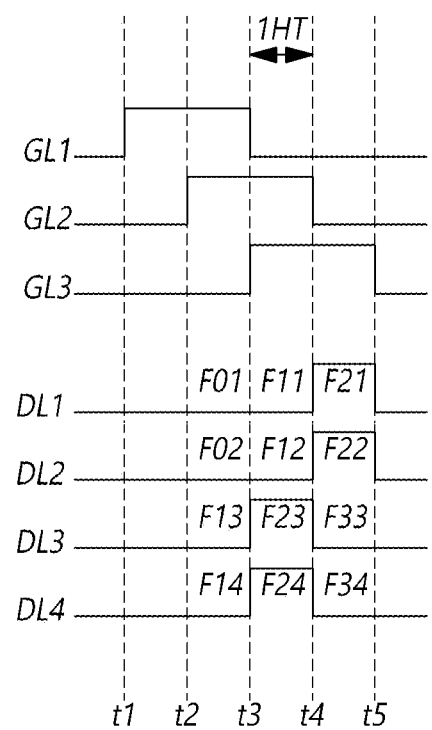
FIG. 14 is a diagram illustrating the timing of a data voltage supplied to data lines to express the second image frame line according to embodiments.

FIG. 14 is a diagram illustrating the timing of a data voltage Vdata supplied to data lines DL to express the second image frame line Frame Line 2 according to embodiments.

Referring to FIG. 14, the second image frame line Frame Line 2 may be expressed by generating light from some subpixels SP electrically connected to a second gate line GL2 and some subpixels SP electrically connected to a third gate line GL3. For the convenience of explanation, first to fourth data lines DL1 to DL4 will be taken as an example.

Referring to FIG. 14, a turn-on gate signal may be supplied to the second gate line GL2 from a second time point t2 to a fourth time point t4. When the turn-on gate signal is supplied to the second gate line GL2, the data voltage Vdata may be supplied to the data lines DL from a third time point t3 to the fourth time point t4. When m is assumed to be a natural number equal to or greater than 1, an image frame voltage F for expressing the second image frame line Frame Line 2 may be supplied to a data line DL corresponding to the (4m−1)th column. The image frame voltage F for expressing the second image frame line Frame Line 2 may be supplied to a data line DL corresponding to the 4mth column. For example, referring to FIG. 14, a 23rd image frame voltage F23 may be supplied to the third data line DL3, and a 24th image frame voltage F24 may be supplied to the fourth data line DL4.

Referring to FIG. 14, the turn-on gate signal may be supplied to the third gate line GL3 from the third time point t3 to a fifth time point t5. When the turn-on gate signal is supplied to the third gate line GL3, the data voltage Vdata may be supplied to the data lines DL from the fourth time point t4 to the fifth time point t5. When m is assumed to be a natural number equal to or greater than 1, the image frame voltage F for expressing the second image frame line Frame Line 2 may be supplied to a data line DL corresponding to the (4m−3)th column. The image frame voltage F for expressing the second image frame line Frame Line 2 may be supplied to a data line DL corresponding to the (4m−2)th column. For example, referring to FIG. 14, a 21st image frame voltage F21 may be supplied to the first data line DL1, and a 22nd image frame voltage F22 may be supplied to the second data line DL2.

That is, the second image frame line Frame Line 2 may be expressed on the basis of the data voltage Vdata supplied from the third time point t3 to the fourth time point t4 and the data voltage Vdata supplied from the fourth time point t4 to the fifth time point t5. The second image frame line Frame Line 2 may be expressed on the basis of the data voltages Vdata supplied during different time periods by the 1HT delayed supply method.

Embodiments of the present disclosure may improve the readability of the display device 100 by the "1HT delayed supply method." That is, since the timing of supply of the image frame voltage F, i.e., a data voltage Vdata, is controlled, the readability of the display device 100 may be improved. The "1HT delayed supply method" is characterized in that image frame voltages F for expressing different image frame lines Frame Line are supplied to subpixels SP electrically connected to the same gate line GL. Before description of the characteristics in that the image frame voltages F for expressing different image frame lines Frame Line are supplied to the subpixels SP, a method of driving each of the plurality of subpixels SP will be described.

Figure 15:
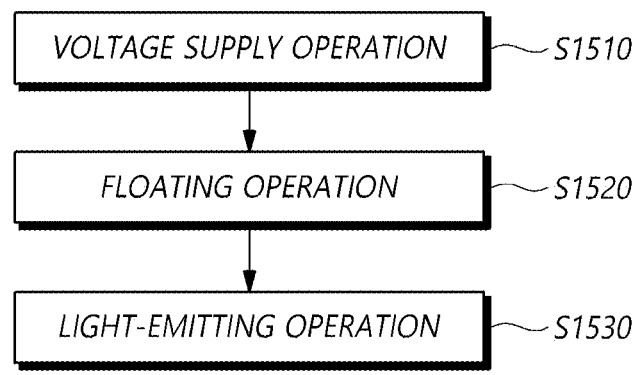
FIG. 15 is a flowchart illustrating a driving method according to embodiments in which a single subpixel is driven.

FIG. 15 is a flowchart illustrating a driving method according to embodiments in which a single subpixel SP is driven.

The driving method in which a single subpixel SP is driven may include a voltage supply operation S1510, a floating operation S1520, and a light-emitting operation S1530.

The voltage supply operation S1510 may be an operation of supplying voltages to the first node N1 and the second node N2 serving as the gate node and the source node of the driving transistor DRT included in each of subpixels SP. A data voltage Vdata may be supplied to the first node N1, and a reference voltage Vref may be supplied to the second node N2. The voltages supplied to the first node N1 and the second node N2 may be stored in the storage capacitor Cst. The voltage stored in the storage capacitor Cst may be a gate-source voltage Vgs. As the gate-source voltage Vgs is stored in the storage capacitor Cst, the difference in voltage between the gate node N1 and the source node N2 of the driving transistor may be maintained as the gate-source voltage Vgs after the voltage supply operation S1510. The floating operation S1520 may be performed after the voltage supply operation S1510.

The floating operation S1520 may be an operation in which the voltage of the second node N2 increases. In the floating operation S1520, the scan transistor SCT and the sensing transistor SENT may be switched in a turned-off state. That is, as no voltages are supplied to the first node N1 and the second node N2, each of the voltage of the first node N1 and the voltage of the second node N2 may be in a floating state.

Since the gate-source voltage Vgs is stored in the storage capacitor Cst during the voltage supply operation S1510, the driving transistor DRT is in a turned-on state. Thus, in the floating operation S1520, a drive current Ids may flow through the driving transistor DRT. The drive current Ids may flow from the third node N3, i.e., the drain node, of the driving transistor DRT to the second node N2, i.e., the source node, of the driving transistor DRT. As the drive current Ids flows to the second node N2, the voltage of the second node N2 increases. Here, the voltage on both ends of the storage capacitor Cst is maintained as the charged gate-source voltage Vgs. Thus, when the voltage of the second node N2 increases, the voltage of the first node N1 may also increase.

After the floating operation S1520, the light-emitting operation S1530 may be performed. In the light-emitting operation S1530, the emitting device ED may generate light at a predetermined luminosity level. The predetermined luminosity level of the emitting device ED is controlled by the drive current Ids.

The subpixel SP may generate light during the floating operation S1520 on the basis of the voltage supplied in the voltage supply operation S1510. That is, the luminosity level at which the subpixel SP generates light is determined by the voltage supplied in the voltage supply operation S1510. In addition, the image frame line Frame Line expressed by the subpixel SP may be determined by the voltage supplied in the voltage supply operation S1510. That is, the readability of the display device 100 may be improved by controlling the voltage supplied during the voltage supply operation S1510. The turn-on gate signal may be sequentially supplied to the gate lines GL. When the turn-on gate signal is supplied, the voltage supply operation S1510 may be performed. That is, since the turn-on gate signal is sequentially supplied to the gate lines GL, a plurality of voltage supply operations S1510 may also be sequentially performed. The plurality of voltage supply operations S1510 may include first to (n+1)th row data voltage supply operations S1510_1 to S1510_n+1. Hereinafter, the features of the plurality of voltage supply operations S1510 will be described.

Figure 16:
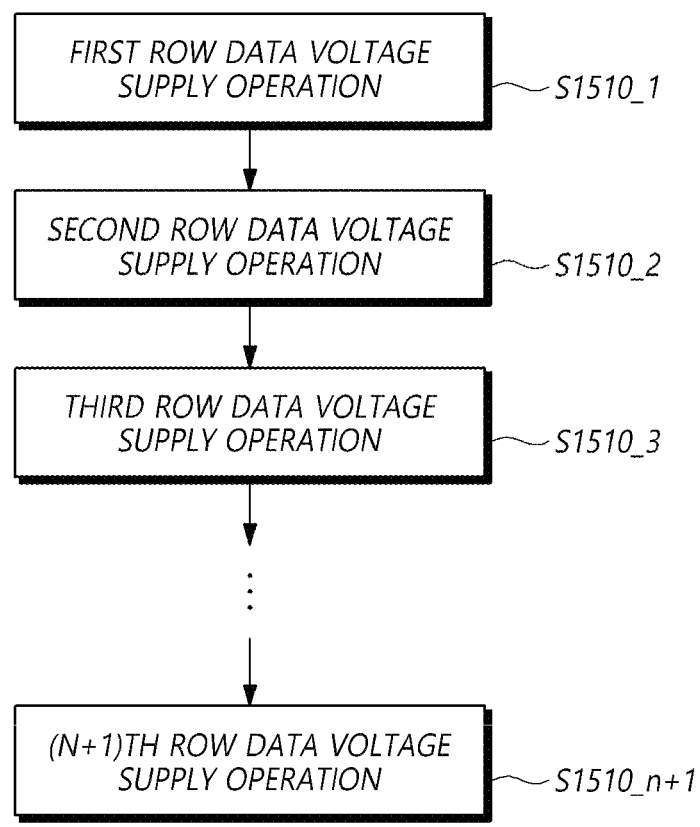
FIG. 16 is a flowchart of the plurality of voltage supply operations according to embodiments.
Figure 17:
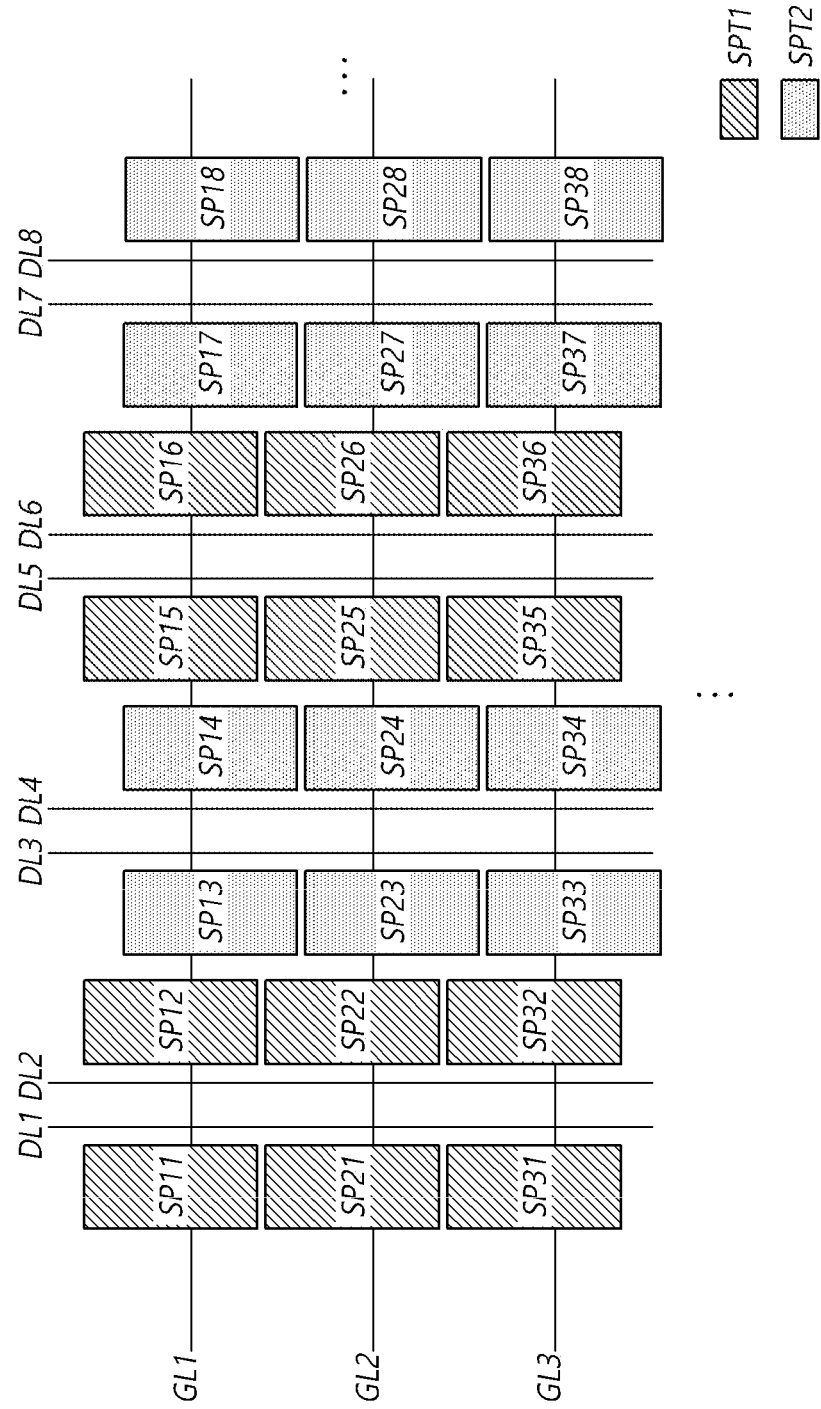
FIG. 17 is a diagram illustrating a plurality of subpixels SP disposed in a zigzag pattern in the display panel according to embodiments.

FIG. 16 is a flowchart of the plurality of voltage supply operations S1510 according to embodiments. FIG. 17 is a diagram illustrating a plurality of subpixels SP disposed in a zigzag pattern in the display panel 810 according to embodiments. FIGS. 18 to 21 are diagrams illustrating the data voltage supply operations S1510 according to embodiments.

Referring to FIG. 17, it may be viewed that the plurality of subpixels SP are disposed in a zigzag pattern in the display panel 1210. Referring to FIG. 4, it may be viewed that the matrix type subpixel SP' connected to the same gate line GL' are disposed in the same row. In contrast, when the subpixels SP are disposed in the zigzag pattern, the subpixels SP electrically connected to the same gate line GL may be disposed in different rows.

Referring to FIGS. 18 to 21, each of the plurality of subpixels SP may include the circuit portion SP_c and the open area SP_e.

Referring to FIGS. 18 to 21, the open area SP_e of a subpixel SP electrically connected to the (g+1)th gate line GLg+1 and the circuit portion SP_c of another subpixel SP electrically connected to the (g+1)th gate line GLg+1 may be disposed between the gth gate line GLg and the (g+1)th gate line GLg+1. The open area SP_e of a subpixel SP electrically connected to the (g+1)th gate line GLg+1 and the open area SP_e of another subpixel SP electrically connected to the gth gate line GLg may be disposed between the gth gate line GLg and the (g+1)th gate line GLg+1.

Referring to FIGS. 12A and 12B, the open area SP_e for expressing the first image frame line Frame Line 1 may be disposed between the first gate line GL1 and the second gate line GL2.

Referring to FIGS. 12A and 12B, the open area SP_e for expressing the second image frame line Frame Line 2 may be disposed between the second gate line GL2 and the third gate line GL3.

Referring to FIGS. 12A and 12B, the open area SP_e for expressing the third image frame line Frame Line 3 may be disposed between the third gate line GL3 and the fourth gate line GL4.

That is, the open area SP_e for expressing the gth image frame line Frame Line g may be disposed between the gth gate line GLg and the (g+1)th gate line GLg+1.

The plurality of data lines DL may include first type data lines DLT1 and second type data lines DLT2.

The plurality of subpixels SP may include first type subpixels SPT1 and second type subpixels SPT2.

Referring to FIG. 17, the first type subpixels SPT1 may be viewed as subpixels SP connected to a gate lines GL, wherein the open areas SP_e of the subpixels SP are disposed in the upward direction of the gate line GL. A first data line DL1, a second data line DL2, a fifth data line DL5, and a sixth data line DL6 may be electrically connected to the first type subpixels SPT1. The first data line DL1, the second data line DL2, the fifth data line DL5, and the sixth data line DL6 may be the first type data lines DLT1.

Referring to FIG. 17, the second type subpixels SPT2 may be viewed as subpixels SP connected to a gate line GL, wherein the open areas SP_e of the subpixels SP are disposed in the downward direction of the gate line GL. A third data line DL3, a fourth data line DL4, a seventh data line DL7, and an eighth data line DL8 may be electrically connected to the second type subpixels SPT2. The third data line DL3, the fourth data line DL4, the seventh data line DL7, and the eighth data line DL8 may be the second type data lines DLT2.

When an ath image frame voltage Fa for expressing an ath image frame line Frame Line a is supplied to the first type data lines DLT1, an (a+1)th image frame voltage Fa+1 for expressing an (a+1)th image frame line Frame Line a+1 may be supplied to the second type data lines DLT2.

When a turn-on gate signal is supplied to an (a+1)th gate line GLa+1, the ath image frame voltage Fa may be supplied to the first type data lines DLT1, and the (a+1)th image frame voltage Fa+1 may be supplied to the second type data lines DLT2.

Hereinafter, the image frame voltage F supplied during the plurality of voltage supply operations S1510 will be described.

Referring to FIG. 16, the plurality of voltage supply operations S1510 may include first to (n+1)th row data voltage supply operations S1510_1 to S1510_$n$+1.

Figure 18:
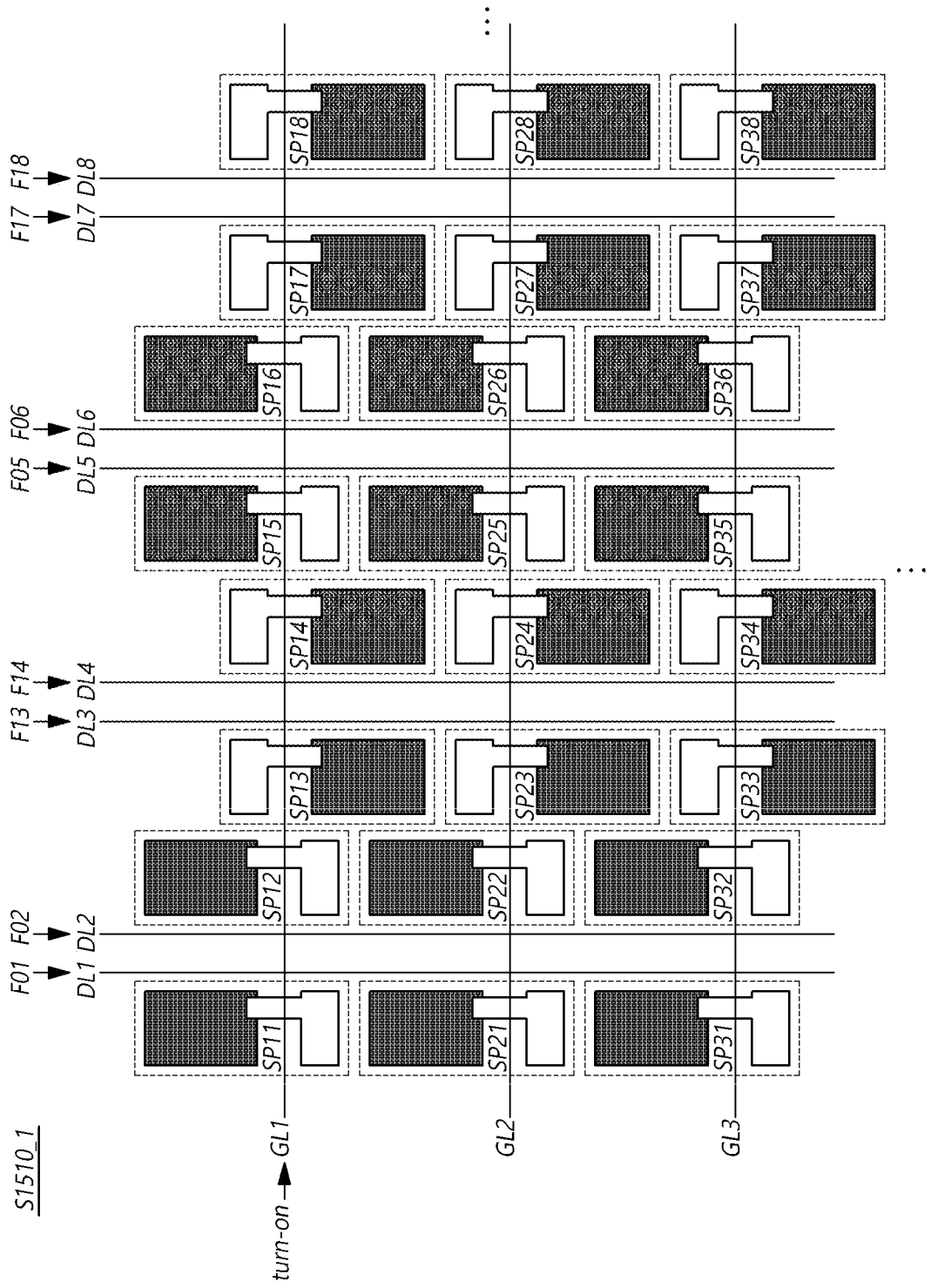
FIGS. 18 to 21 are diagrams illustrating the data voltage supply operations according to embodiments.

Referring to FIG. 18, the first row data voltage supply operation S1510_1 may be an operation of supplying the turn-on gate signal to the first gate line GL1, supplying a zeroth image frame voltage F0 for expressing a zeroth image frame line Frame Line 0 to the first type data lines DLT1, and supplying a first image frame voltage F1 for expressing the first image frame line Frame Line 1 to the second type data lines DLT2.

The zeroth image frame line Frame Line 0 may not be required for expressing the image frame Frame. Thus, the zeroth image frame voltage F0 for expressing the zeroth image frame line Frame Line 0 may be supplied as a data voltage Vdata for expressing black. Alternatively, the zeroth image frame line Frame Line 0 may not be required for expressing the image frame Frame, and thus the data voltage Vdata may not be supplied to the first type data lines DLT1. The zeroth image frame voltage F0 for expressing the zeroth image frame line Frame Line 0 may be referred to as a dummy voltage. The dummy voltage may not be a voltage for expressing the image frame Frame, and thus may be a voltage different from the data voltage Vdata for expressing the image frame Frame.

Referring to FIG. 18, in the first row data voltage supply operation S1510_1, the zeroth image frame voltage F0 for expressing the zeroth image frame line Frame Line 0 may be supplied to the first type subpixels SPT1, and the first image frame voltage F1 for expressing the first image frame line Frame Line 1 may be supplied to the second type subpixels SPT2.

As the turn-on gate signal is supplied to the first gate line GL1, the image frame voltage F, i.e., a data voltage Vdata, may be supplied to the first type subpixels SPT1. Referring to FIG. 18, a (01)th image frame voltage F01 may be supplied to the 11th subpixel SP11, a (02)th image frame voltage F02 may be supplied to the 12th subpixel SP12, a (05)th image frame voltage F05 may be supplied to the 15th subpixel SP15, and a (06)th image frame voltage F06 may be supplied to the 16th subpixel SP16.

As the turn-on gate signal is supplied to the first gate line GL1, the image frame voltage F, i.e., a data voltage Vdata, may be supplied to the second type subpixels SPT2. Referring to FIG. 18, a 13th image frame voltage F13 may be supplied to the 13th subpixel SP13, a 14th image frame voltage F14 may be supplied to the 14th subpixel SP14, a 17th image frame voltage F17 may be supplied to the 17th subpixel SP17, and an 18th image frame voltage F18 may be supplied to the 18th subpixel SP18.

Figure 19:
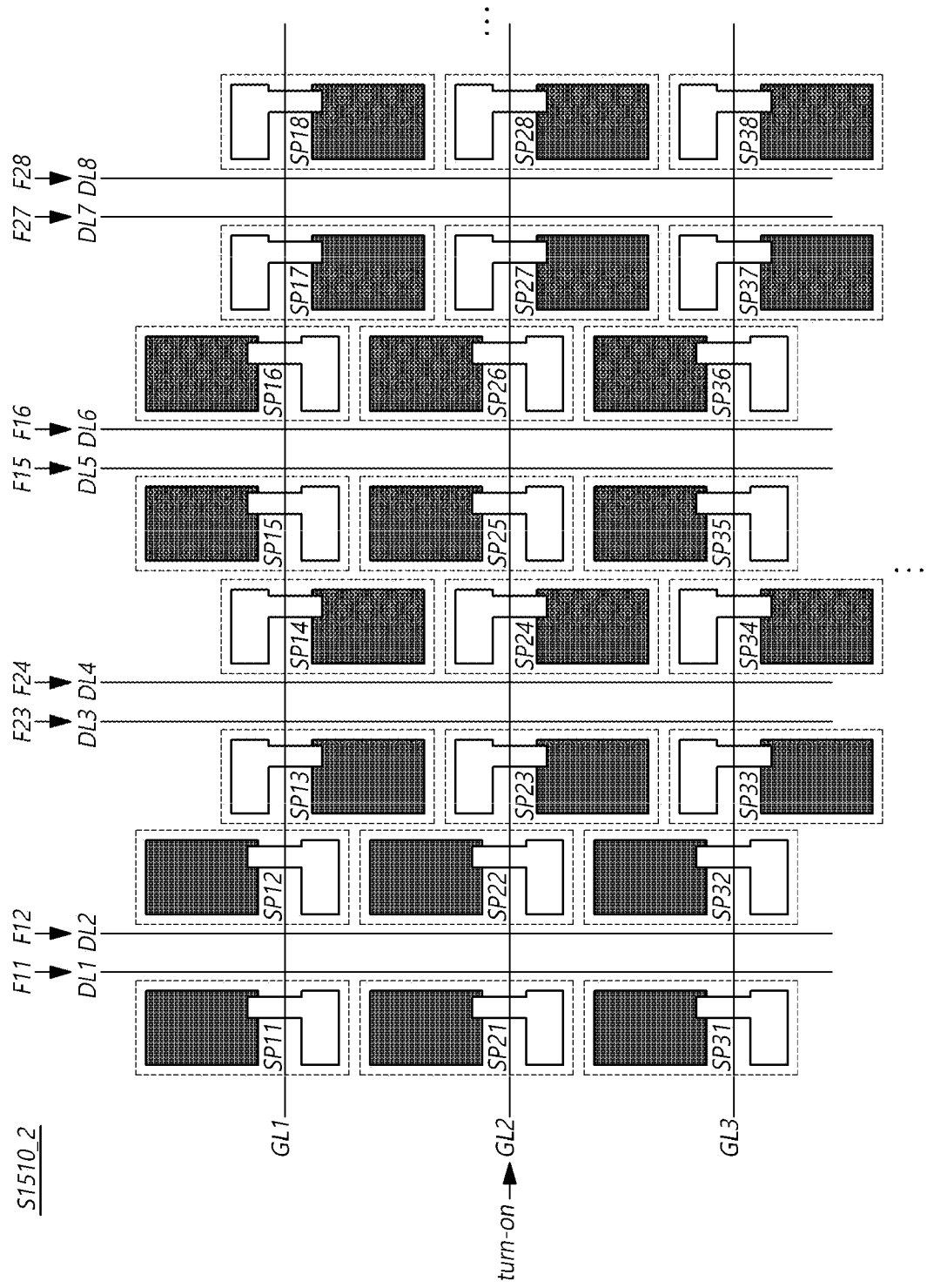

Referring to FIG. 19, in the second row data voltage supply operation S1510_2, the turn-on gate signal may be supplied to the second gate line GL2, a first image frame voltage F1 for expressing the first image frame line Frame Line 1 may be supplied to the first type data lines DLT1, and a second image frame voltage F2 for expressing the second image frame line Frame Line 2 may be supplied to the second type data lines DLT2.

Referring to FIG. 19, in the second row data voltage supply operation S1510_2, the first image frame voltage F1 for expressing the first image frame line Frame Line 1 may be supplied to the first type subpixels SPT1, and the second image frame voltage F2 for expressing the second image frame line Frame Line 2 may be supplied to the second type subpixels SPT2.

As the turn-on gate signal is supplied to the second gate line GL2, the image frame voltage F, i.e., a data voltage Vdata, may be supplied to the first type subpixels SPT1. Referring to FIG. 19, an 11th image frame voltage F11 may be supplied to the 11th subpixel SP11, a 12th image frame voltage F12 may be supplied to the 12th subpixel SP12, a 15th image frame voltage F15 may be supplied to the 15th subpixel SP15, and a 16th image frame voltage F16 may be supplied to the 16th subpixel SP16.

As the turn-on gate signal is supplied to the second gate line GL2, the image frame voltage F, i.e., a data voltage Vdata, may be supplied to the second type subpixels SPT2. Referring to FIG. 19, a 23rd image frame voltage F23 may be supplied to the 13th subpixel SP13, a 24th image frame voltage F24 may be supplied to the 14th subpixel SP14, a 27th image frame voltage F27 may be supplied to the 17th subpixel SP17, and a 28th image frame voltage F28 may be supplied to the 18th subpixel SP18.

Figure 20:
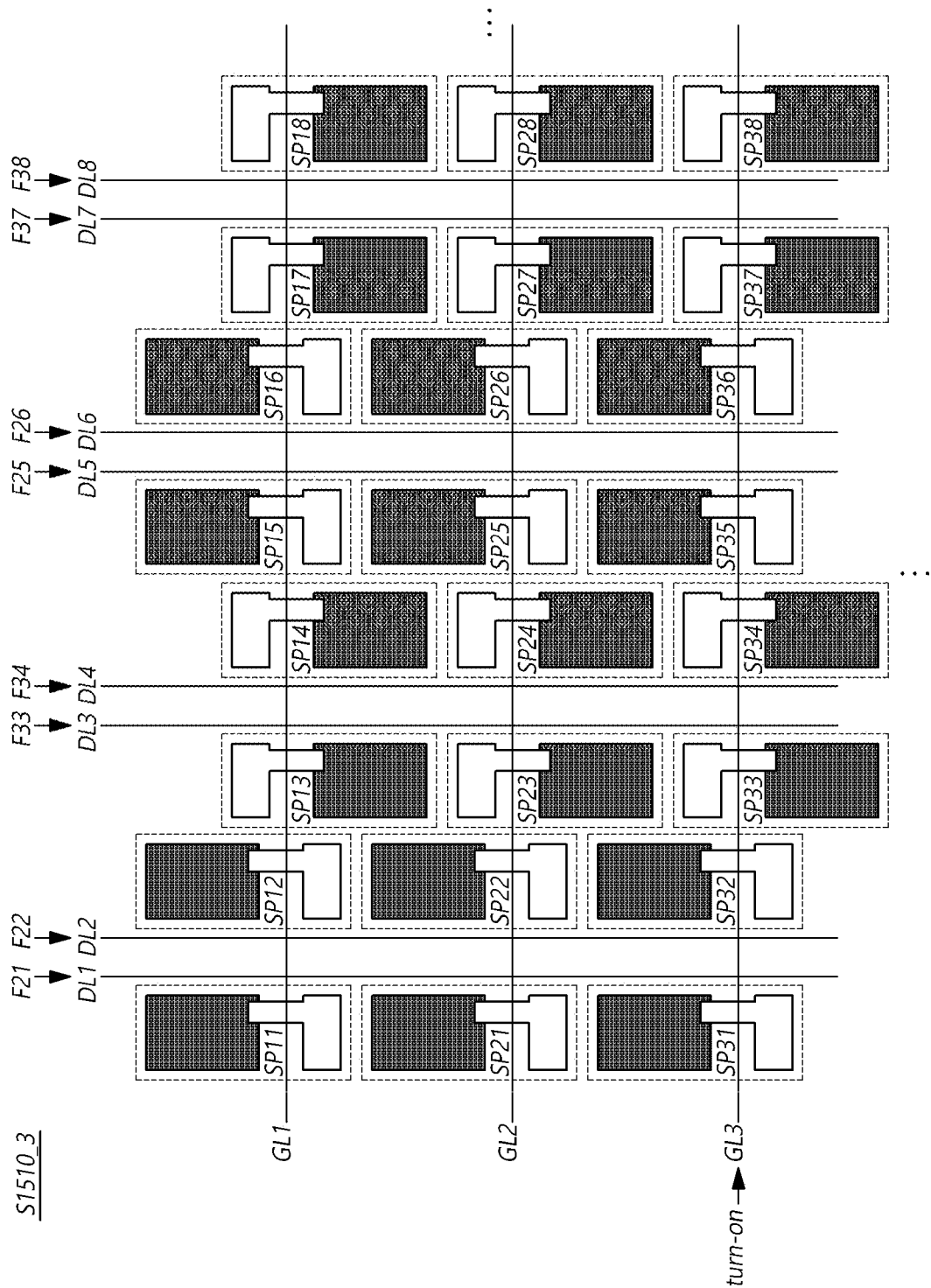

Referring to FIG. 20, in the third row data voltage supply operation S1510_3, the turn-on gate signal may be supplied to the third gate line GL3, a second image frame voltage F2 for expressing the second image frame line Frame Line 2 may be supplied to the first type data lines DLT1, and a third image frame voltage F3 for expressing the third image frame line Frame Line 3 may be supplied to the second type data lines DLT2.

Referring to FIG. 20, in third row data voltage supply operation S1510_3, the second image frame voltage F2 for expressing the second image frame line Frame Line 2 may be supplied to the first type subpixels SPT1, and the third image frame voltage F3 for expressing the third image frame line Frame Line 3 may be supplied to the second type subpixels SPT2.

As the turn-on gate signal is supplied to the third gate line GL3, the image frame voltage F, i.e., a data voltage Vdata, may be supplied to the first type subpixels SPT1. Referring to FIG. 20, a 21st image frame voltage F21 may be supplied to the 11th subpixel SP11, a 22nd image frame voltage F22 may be supplied to the 12th subpixel SP12, a 25th image frame voltage F25 may be supplied to the 15th subpixel SP15, and a 26th image frame voltage F26 may be supplied to the 16th subpixel SP16.

As the turn-on gate signal is supplied to the third gate line GL3, the image frame voltage F, i.e., a data voltage Vdata, may be supplied to the second type subpixels SPT2. Referring to FIG. 20, a 33rd image frame voltage F33 may be supplied to the 13th subpixel SP13, a 34th image frame voltage F34 may be supplied to the 14th subpixel SP14, a 37th image frame voltage F37 may be supplied to the 17th subpixel SP17, and a 38th image frame voltage F38 may be supplied to the 18th subpixel SP18.

By repeating the above description, the fourth row data voltage supply operation S1510_4 and the nth row data voltage supply operation S1510_$n$ may be performed. Since n+1 number of gate lines GL are disposed in the display panel 1210, the (n+1)th row data voltage supply operation S1510_$n$+1 may be performed after the nth row data voltage supply operation S1510_$n$.

In the (n+1)th row data voltage supply operation S1510_$n$+1, the turn-on gate signal may be supplied to the (n+1)th gate line GLn+1, an image frame voltage Fn for expressing the nth image frame line Frame Line n may be supplied to the first type data lines DLT1, and an (n+1)th image frame voltage Fn+1 for expressing the (n+1)th image frame line Frame Line n+1 may be supplied to the second type data lines DLT2.

The (n+1)th image frame line Frame Line n+1 may not be required for expressing the image frame Frame. Thus, the (n+1)th image frame voltage Fn+1 for expressing the (n+1)th image frame line Frame Line n+1 may be supplied as a data voltage Vdata for expressing black. Alternatively, the (n+1)th image frame line Frame Line n+1 may not be required for expressing the image frame Frame, and thus the data voltage Vdata may not be supplied to the first type data lines DLT1. The (n+1)th image frame voltage Fn+1 for expressing the (n+1)th image frame line Frame Line n+1 may be a dummy voltage.

In the (n+1)th row data voltage supply operation S1510_$n$+1, the image frame voltage Fn for expressing the nth image frame line Frame Line n may be supplied to the first type subpixels SPT1, and the (n+1)th image frame voltage Fn+1 for expressing the (n+1)th image frame line Frame Line n+1 may be supplied to the second type subpixels SPT2.

As the turn-on gate signal is supplied to the (n+1)th gate line GLn+1, the image frame voltage F, i.e., a data voltage Vdata, may be supplied to the first type subpixels SPT1. An n1th image frame voltage Fn1 may be supplied to the 11th subpixel SP11, an n2th image frame voltage Fn2 may be supplied to the 12th subpixel SP12, an n5th image frame voltage Fn5 may be supplied to the 15th subpixel SP15, and an n6th image frame voltage Fn6 may be supplied to the 16th subpixel SP16.

As the turn-on gate signal is supplied to the (n+1)th gate line GLn+1, the image frame voltage F, i.e., a data voltage Vdata, may be supplied to the second type subpixels SPT2. An (n+13)th image frame voltage Fn+13 may be supplied to the 13th subpixel SP13, an (n+14)th image frame voltage Fn+14 may be supplied to the 14th subpixel SP14, an (n+17)th image frame voltage Fn+17 may be supplied to the 17th subpixel SP17, and an (n+18)th image frame voltage Fn+18 may be supplied to the 18th subpixel SP18.

Figure 21:
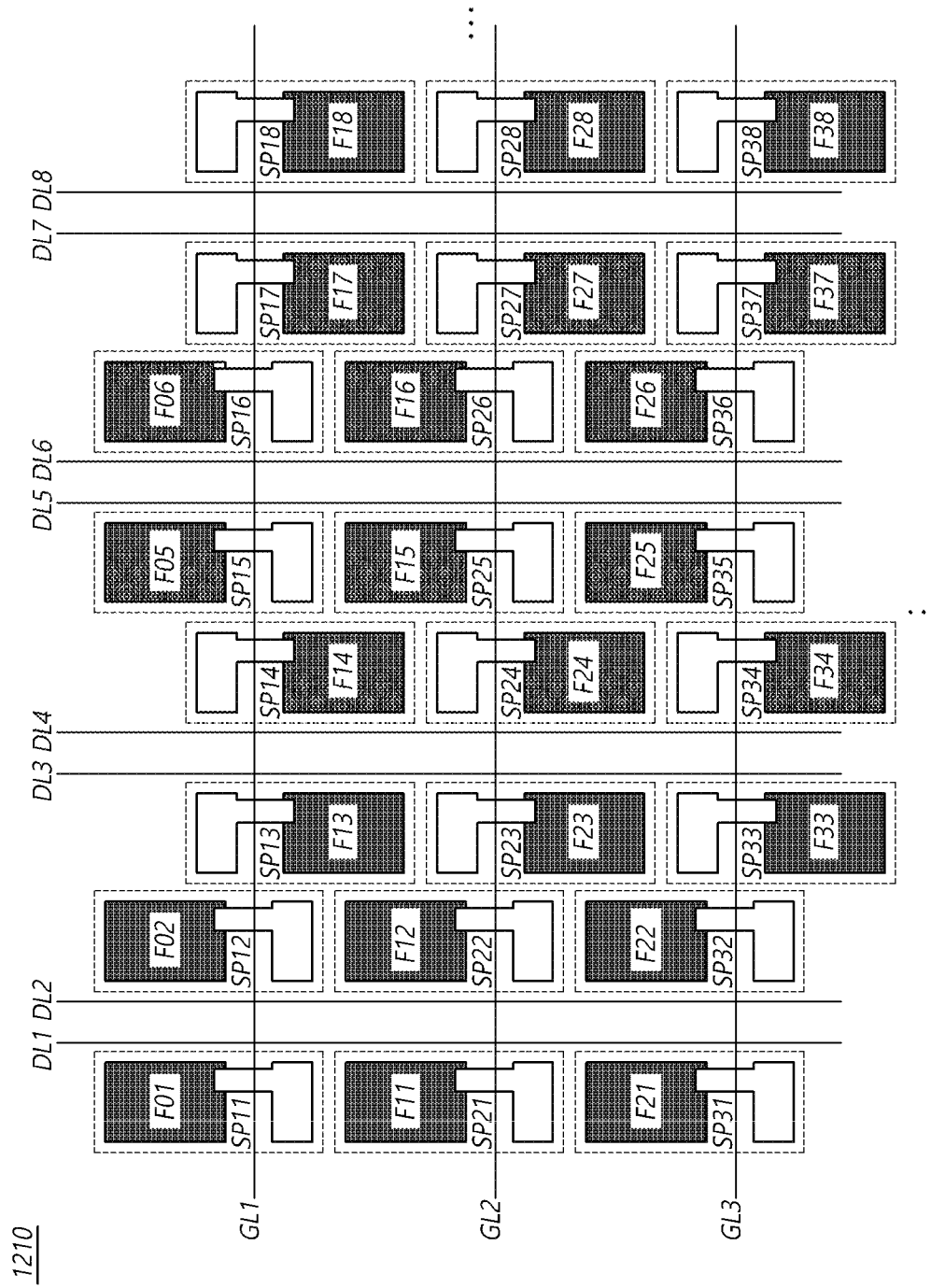

Referring to FIG. 21, the image frame voltage F supplied to each of the plurality of subpixels SP may be viewed. When the image frame voltage F is supplied as illustrated in FIG. 21, the image frame Frame may be expressed by the image frame lines illustrated in FIG. 12B.

That is, the image frame Frame may be expressed using the plurality of frame lines Frame Line. A specific image frame line Frame Line may be expressed on the basis of the image frame voltage F supplied through a first type data line DLT1 and a second type data line DLT2.

In addition, the data voltage Vdata supplied to the first type data line DLT1 and the voltage Vdata supplied to the second type data line DLT2 may be supplied in different periods.

Referring to FIGS. 11B and 12B, the second open area distance difference D2 is smaller than the first open area distance difference D1. That is, it may be viewed that the first open area distance difference D1 of the first image frame line Frame Line 1 is improved to be the second open area distance difference D2 of the first image frame line Frame Line 1.

According to embodiments of the present disclosure, the display device 100 and the driving method thereof in which readability is improved may be provided.

According to embodiments of the present disclosure, the display device and the driving method thereof in which low power driving is enabled due to improved readability may be provided.

The above-described embodiments of the present disclosure will be briefly reviewed as follows.

According to embodiments of the present disclosure, provided is a display device including a plurality of subpixels electrically connected to a plurality of data lines and a plurality of gate lines. An image frame voltage may be supplied to the plurality of data lines as a data voltage for expressing an image frame. The image frame may be expressed by a plurality of image frame lines. The plurality of data lines may include a first type data line and a second type data line. While a turn-on gate signal is being supplied to a first gate line among the plurality of gate lines, a dummy voltage different from the image frame voltage may be supplied to the first type data line, and a first image frame voltage for expressing a first image frame line may be supplied to the second type data line.

A (1-1)th subpixel and a (1-2)th subpixel may be electrically connected to the first gate line, the (1-1)th subpixel may be electrically connected to the first type data line, and the (1-2)th subpixel may be electrically connected to the second type data line.

The (1-1)th subpixel and the (1-2)th subpixel may be disposed in different rows.

An open area of the (1-1)th subpixel may be disposed in an upward direction of the first gate line. An open area of the (1-2)th subpixel may be disposed in a downward direction of the first gate line.

A (2-1)th subpixel and a (2-2)th subpixel may be electrically connected to a second gate line among the plurality of gate lines disposed at a different position from the first gate line. The (2-1)th subpixel may be electrically connected to the first type data line. The (2-2)th subpixel may be electrically connected to the second type data line.

The first image frame line may be expressed by the image frame voltage supplied to the (2-1)th subpixel through the first type data line and the first image frame voltage supplied to the (1-2)th subpixel through the second type data line.

The first image frame line may be expressed using a first data voltage supplied through the first type data line and a second data voltage supplied through the second type data line. The first data voltage and the second data voltage may be supplied in different periods.

The plurality of gate lines may include first to (n+1)th gate lines. While a turn-on gate signal is being supplied to the nth gate line, a voltage for expressing an nth image frame line may be supplied to the second type data line. While a turn-on gate signal is being supplied to the (n+1)th gate line, a voltage for expressing the nth image frame line may be supplied to the first type data line.

Each of the plurality of subpixels may include an open area for expressing the image frame and a circuit part on which a circuit allowing light to exit through the open area is disposed.

Each of the plurality of subpixels may include: a light-emitting device expressing the image frame; a driving transistor driving the light-emitting device; and a scan transistor electrically connected to a gate node of the driving transistor and a corresponding data line among the plurality of data lines.

Also provided is a display device including a plurality of subpixels electrically connected to a plurality of data lines and a plurality of gate lines. An image frame voltage may be supplied to the plurality of data lines as a data voltage for expressing an image frame, the image frame is expressed by a plurality of image frame lines. Each of the plurality of subpixels may include an open area for expressing the image frame and a circuit part on which a circuit allowing light to exit through the open area is disposed. The open area for expressing the image frame may be disposed between a first gate line and a second gate line among the plurality of gate lines.

A first subpixel among plurality of subpixels may be electrically connected to the first gate line. A second subpixel among plurality of subpixels may be electrically connected to the second gate line. The open area of the first subpixel and the open area of the second subpixel may be disposed between the first gate line and the second gate line.

A third subpixel among the plurality of subpixels may be electrically connected to the second gate line. The open area of the second subpixel and the circuit part of the third subpixel may be disposed between the first gate line and the second gate line.

A first data voltage supplied to the first subpixel and a second data voltage supplied to the second subpixel may be supplied in different periods.

The plurality of gate lines may include first to (n+1)th gate lines. The open area for expressing an nth image frame line may be disposed between the (n+1)th gate line and the nth gate line.

Also provided is a display device including a plurality of subpixels electrically connected to a plurality of data lines and a plurality of gate lines. The plurality of gate lines may include first to (n+1)th gate lines. A dummy voltage may be supplied to a first subpixel among the plurality of subpixels electrically connected to a first data line among the plurality of gate lines and the first gate line. The dummy voltage may be supplied to a second subpixel among the plurality of subpixels electrically connected to a second data line among the plurality of gate lines and the (n+1)th gate line.

The dummy voltage may be a data voltage for expressing black.

A data voltage for expressing an image may be supplied to a subpixel among the plurality of subpixels electrically connected to the second data line and the first gate line. The dummy voltage may be a voltage different from a data voltage for expressing the image frame.

Also provided is a display device driving method including: supplying a voltage to a plurality of subpixels respectively including a light-emitting device expressing an image frame and a driving transistor driving the light-emitting device; a floating operation of increasing a voltage of a source node of the driving transistor, and generating light from the light-emitting device. The supply of the voltage may include: supplying a turn-on gate signal to a first gate line electrically connected to a first subpixel and a second subpixel among the plurality of subpixels; supplying a first image frame voltage for expressing a first image frame line to a second data line electrically connected to the second subpixel; and supplying a dummy voltage different from the first image frame voltage to a first data line electrically connected to the first subpixel.

In a first row data voltage supply operation of the supply of the voltage, the first image frame voltage for expressing the first image frame line may be supplied to the second data line. In a second row data voltage supply operation performed after the first row data voltage supply operation, a voltage for expressing the first image frame line may be supplied to the first data line.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a plurality of subpixels electrically connected to a plurality of data lines and a plurality of gate lines,
wherein the plurality of data lines are configured to receive an image frame voltage for displaying an image frame,
the image frame comprises a plurality of image frame lines,
the plurality of data lines comprise a first type data line and a second type data line, and
in response to a turn-on gate signal being supplied to a first gate line among the plurality of gate lines, the first type data line is configured to receive a dummy voltage different from the image frame voltage, and the second type data line is configured to receive a first image frame voltage for inputting to a first image frame line.

2. The display device according to claim 1, wherein a (1-1)th subpixel and a (1-2)th subpixel are electrically connected to the first gate line,
the (1-1)th subpixel is electrically connected to the first type data line, and
the (1-2)th subpixel is electrically connected to the second type data line.

3. The display device according to claim 2, wherein the (1-1)th subpixel and the (1-2)th subpixel are disposed in different rows.

4. The display device according to claim 2, wherein an open area of the (1-1)th subpixel is disposed in an upward direction of the first gate line, and
an open area of the (1-2)th subpixel is disposed in a downward direction of the first gate line.

5. The display device according to claim 4, wherein a (2-1)th subpixel and a (2-2)th subpixel are electrically connected to a second gate line among the plurality of gate lines, the second gate line disposed at a different position from the first gate line,
the (2-1)th subpixel is electrically connected to the first type data line,
the (2-2)th subpixel is electrically connected to the second type data line, and wherein the (2-1)th subpixel and the (2-2)th subpixel are disposed in different rows.

6. The display device according to claim 5, wherein in response to a turn-on gate signal is being supplied to the second gate line among the plurality of gate lines, the (2-1)th subpixel is configured to receive through the first type data line the first image frame voltage, and the (1-2)th subpixel is configured to receive a second image frame voltage through the second type data line.

7. The display device according to claim 1, wherein the first type data line and the second type data line are connected to input a first data voltage supplied through the first type data line and a second data voltage supplied through the second type data line, respectively, to the first image frame line, and the first type data line and the second type data line are configured to receive the first data voltage and the second data voltage, respectively, in different periods.

8. The display device according to claim 1, wherein the plurality of gate lines comprise first to (n+1)th gate lines, in response to a turn-on gate signal is supplied to an nth gate line, the second type data line is configured to receive a voltage for inputting to an nth image frame line, and in response to a turn-on gate signal is being supplied to the (n+1)th gate line, the first type data line is configured to receive the voltage for inputting to the nth image frame line.

9. The display device according to claim 1, wherein each of the plurality of subpixels comprise an open area that emits light when the subpixel generates light and a circuit part on which a circuit allowing light to exit through the open area is disposed.

\* \* \* \* \*